(12) United States Patent
Hyun et al.

(10) Patent No.: US 11,871,640 B2
(45) Date of Patent: Jan. 9, 2024

(54) DISPLAY DEVICE AND MANUFACTURING METHOD OF THE SAME

(71) Applicant: Samsung Display Co., Ltd., Yongin-Si (KR)

(72) Inventors: Jinho Hyun, Gwacheon-si (KR); Hyoung Sub Lee, Yongin-si (KR); Hyemin Lee, Gimpo-si (KR); Woo Yong Sung, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/088,549

(22) Filed: Dec. 24, 2022

(65) Prior Publication Data

US 2023/0217780 A1    Jul. 6, 2023

(30) Foreign Application Priority Data

Jan. 6, 2022    (KR) ........................ 10-2022-0001941

(51) Int. Cl.
| | |
|---|---|
| *H10K 59/40* | (2023.01) |
| *H10K 59/80* | (2023.01) |
| *G06F 3/044* | (2006.01) |
| *H10K 59/12* | (2023.01) |
| *H10K 59/131* | (2023.01) |

(52) U.S. Cl.
CPC ........... *H10K 59/40* (2023.02); *G06F 3/0446* (2019.05); *H10K 59/1201* (2023.02); *H10K 59/131* (2023.02); *H10K 59/873* (2023.02)

(58) Field of Classification Search
None
See application file for complete search history.

(56) References Cited

U.S. PATENT DOCUMENTS

| | | | |
|---|---|---|---|
| 10,879,491 B1 | 12/2020 | Yoo et al. | |
| 10,916,603 B2 | 2/2021 | Park et al. | |
| 2019/0198587 A1* | 6/2019 | Park | ..................... H10K 59/122 |
| 2020/0127220 A1 | 4/2020 | Kim et al. | |
| 2020/0217780 A1* | 7/2020 | Su | .......................... G01N 33/30 |
| 2020/0401273 A1* | 12/2020 | Bang | ..................... G06F 3/0443 |
| 2021/0202895 A1* | 7/2021 | Kang | .................. H10K 50/844 |
| 2022/0164051 A1* | 5/2022 | Lee | ..................... H10K 50/844 |

FOREIGN PATENT DOCUMENTS

| | | |
|---|---|---|
| KR | 10-2019-0076093 | 7/2019 |
| KR | 10-2020-0046221 | 5/2020 |
| KR | 10-2021-0020203 | 2/2021 |

\* cited by examiner

*Primary Examiner* — Nicholas J Lee
(74) *Attorney, Agent, or Firm* — F. Chau & Associates, LLC

(57) ABSTRACT

A display device includes: a display panel including a base layer, a light emitting element layer, and an encapsulation layer; and an input detection unit disposed on the display panel, wherein the display panel includes: a first side and a second side, wherein the encapsulation layer includes an organic encapsulation layer including: an inclined part adjacent to the first side and the second side; and a flat part extending from the inclined part, wherein a first angle formed by the inclined part with respect to an upper surface of the base layer in a first part of the display panel and input detection unit adjacent to the first side is less than a second angle formed by the inclined part with respect to the upper surface of the base layer in a second part of the display panel and input detection unit adjacent to the second side.

20 Claims, 17 Drawing Sheets

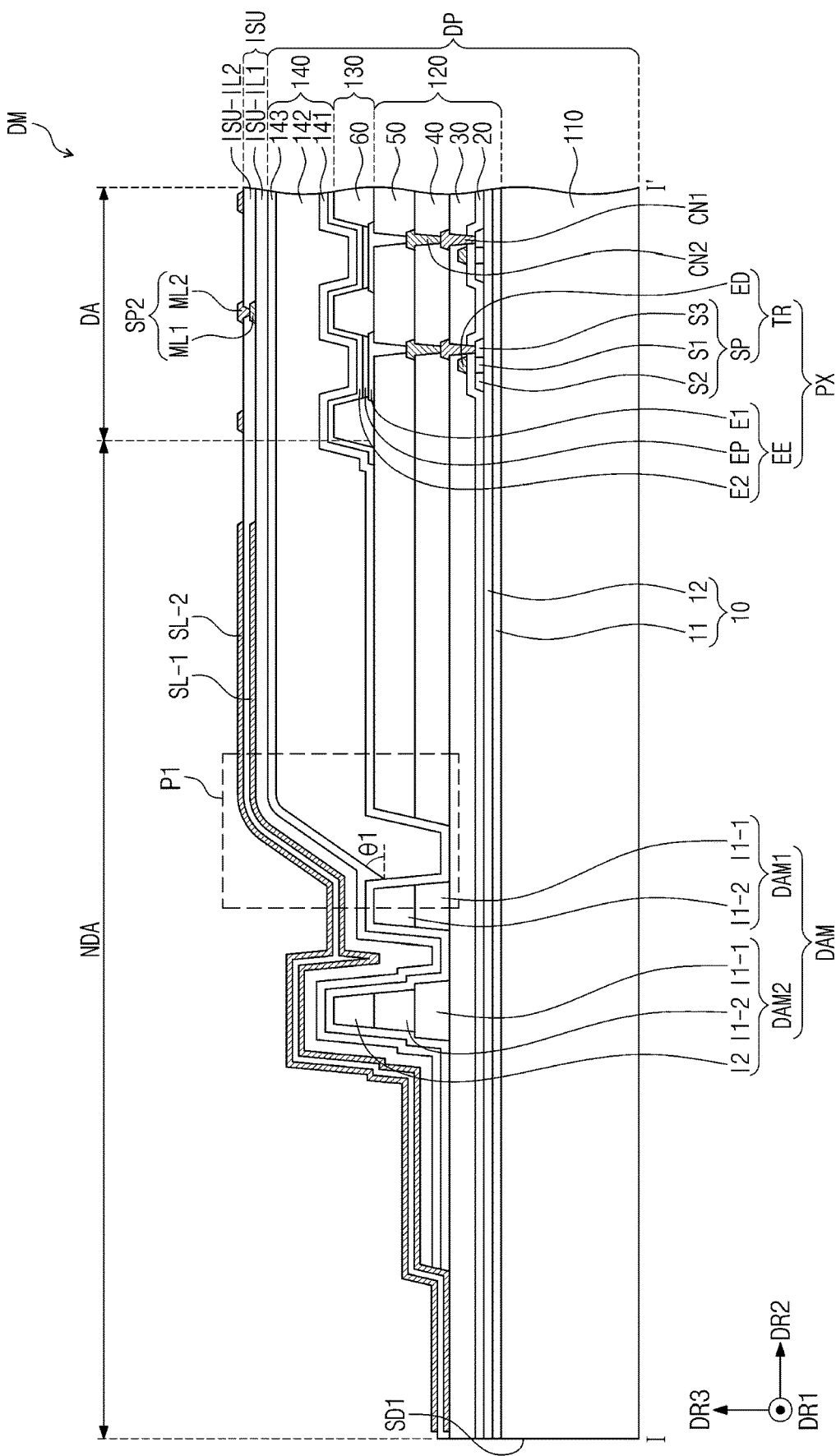

DISPLAY DEVICE AND MANUFACTURING METHOD OF THE SAME

CROSS-REFERENCE TO RELATED APPLICATION

This U.S. non-provisional patent application claims priority under 35 U.S.C. § 119 to Korean Patent Application No. 10-2022-0001941, filed on Jan. 6, 2022, the disclosure of which is incorporated by reference herein in its entirety.

TECHNICAL FIELD

The present inventive concept relates to a display device and a manufacturing method thereof, and more particularly, to a display device including a dam structure and an encapsulation layer and a manufacturing method thereof.

DISCUSSION OF THE RELATED ART

Generally, a display device may include a display panel and an input detection unit. The display panel displays an image, and the input detection unit senses an external input. For example, the input detection unit may be integrally formed with the display pan& through a continuous process. As another example, the input detection unit may be formed through a process separate from the display panel, and then, the input detection unit may be coupled to the display panel.

Recently, a structure of a flexible display device in which a non-display area is minimized or a non-display area is bent to increase visibility and reduce a dead space has been proposed and under development. In addition, to ensure that the display device has relatively high durability even when the dead space is reduced, a process design for securing the minimum thickness of each component of the display device may be desirable.

SUMMARY

The present inventive concept provides a display device capable of preventing damage to a wire and minimizing a dead space, and a method of manufacturing the same.

According to an embodiment of the present inventive concept, a display device includes: a display panel including a display area and a non-display area, the display panel including a base layer, a light emitting element layer disposed on the base layer and including a light emitting element, and an encapsulation layer disposed on the light emitting element; and an input detection unit disposed on the display panel, the input detection unit including a detection pad, a detection electrode, and a signal line, wherein the detection pad is disposed in a pad area overlapping the non-display area, wherein the detection electrode overlaps the display area, and the signal line connects the detection pad and the detection electrode to each other, wherein the display panel includes: a first side extending in a first direction; and a second side extending in a second direction crossing the first direction, wherein the detection pad is disposed adjacent to the first side, wherein the encapsulation layer includes an organic encapsulation layer, wherein the organic encapsulation layer includes: an inclined part adjacent to the first side and the second side; and a flat part extending from the inclined part, wherein a first angle formed by the inclined part with respect to an upper surface of the base layer in a first part of the display panel and input detection unit adjacent to the first side is less than a second angle formed by the inclined part with respect to the upper surface of the base layer in a second part of the display panel and input detection unit adjacent to the second side.

In an embodiment of the present inventive concept, the display panel further includes a dam structure disposed adjacent to the first side and the second side, wherein the organic encapsulation layer is in contact with a side surface of the dam structure.

In an embodiment of the present inventive concept, a minimum distance from a contact point, which is where the inclined part and the side surface of the dam structure contact each other, to the flat part is an inclination distance, wherein a first inclination distance that is the inclination distance in the first part is greater than a second inclination distance that is the inclination distance in the second part.

In an embodiment of the present inventive concept, a difference between the first inclination distance and the second inclination distance is about 40 micrometers or more and about 200 micrometers or less.

In an embodiment of the present inventive concept, the dam structure includes a first dam structure and a second dam structure spaced further apart from the display area than the first darer structure, wherein the organic encapsulation layer is in contact with a side surface of the first dam structure.

In an embodiment of the present inventive concept, the display device further includes a circuit layer disposed between the base layer and the light emitting element layer and including a plurality of insulating layers, wherein the dam structure includes a plurality of layers corresponding to at least some of the plurality of insulating layers.

In an embodiment of the present inventive concept, the dam structure has a shape at least partially surrounding the display area.

In an embodiment of the present inventive concept, the first angle and the second angle are formed at a contact point where the organic encapsulation layer and the side surface of the dam structure contact.

In an embodiment of the present inventive concept, the organic encapsulation layer further includes a protruding part disposed between the inclined part and the flat part and including a protruding surface protruding in a third direction intersecting the first and second directions.

In an embodiment of the present inventive concept, a difference between the first angle and the second angle is about 0.05 degrees or more and about 0.2 degrees or less.

In an embodiment of the present inventive concept, the encapsulation layer further includes a plurality of inorganic encapsulation layers, wherein the organic encapsulation layer is disposed between the plurality of inorganic encapsulation layers.

In an embodiment of the present inventive concept, the input detection unit includes: a first detection insulating layer disposed on the encapsulation layer; a first conductive layer disposed on the first detection insulating layer; a second detection insulating layer disposed on the first conductive layer; a second conductive layer disposed on the second detection insulating layer; and a third detection insulating layer disposed on the second conductive layer.

In an embodiment of the present inventive concept, the signal line includes a first signal line and a second signal line, wherein the first signal line is disposed on the first detection insulating layer, and the second signal line is disposed on the second detection insulating layer.

According to an embodiment of the present inventive concept, a display device includes: a display panel including a display area and a non-display area, the display panel including a light emitting element layer with a light emitting element overlapping the display area, an encapsulation layer disposed on the light emitting element, and a dam structure overlapping the non-display area; and an input detection unit disposed on the display panel, the input detection unit including a detection pad, a detection electrode, and a signal line, wherein the detection pad is disposed in a pad area overlapping the non-display area, wherein the detection electrode overlaps the display area, and the signal line connects the detection pad and the detection electrode to each other, wherein the display panel includes: a first side extending in a first direction; and a second side extending in a second direction crossing the first direction, wherein the detection pad is disposed adjacent to the first side, wherein the encapsulation layer includes an organic encapsulation layer, wherein the organic encapsulation layer includes: an inclined part adjacent to the first side and the second side; and a flat part connected to the inclined part, wherein a minimum distance from a contact point, at which the organic encapsulation layer and a side surface of the dam structure contact each other, to the flat part is an inclination distance, wherein a first inclination distance that is the inclination distance in a first part of the display panel and input detection unit is greater than a second inclination distance that is the inclination distance in a second part of the display panel and input detection unit.

In an embodiment of the present inventive concept, a difference between the first inclination distance and the second inclination distance is about 40 micrometers or more and about 200 micrometers or less.

In an embodiment of the present inventive concept, the dam stricture has a shape at least partially surrounding the display area.

According to an embodiment of the present inventive concept, a method for manufacturing a display device includes: preparing a display panel including a display area and a non-display area, the display panel including a base layer, a light emitting element layer disposed on the base layer and including a light emitting element, and an encapsulation layer disposed on the light emitting element; and forming an input detection unit disposed on the display panel, the input detection unit including a detection pad, a detection electrode, and a signal line, wherein the detection pad is disposed in a pad area overlapping the non-display area, wherein the detection electrode overlaps the display area, and the signal line connect the detection pad and the detection electrode to each other, wherein the display panel includes: a first side extending in a first direction; and a second side extending in a second direction crossing the first direction, wherein the detection pad is formed adjacent to the first side, wherein the forming of the encapsulation layer includes: applying an organic material; performing a delay operation of maintaining the applied organic material for a predetermined delay time; and curing the organic material after the predetermined delay time, wherein, in a first part of the display panel and the input detection unit adjacent to the first side, the organic material is maintained for a first delay time in the delay operation, wherein, in a second part of the display panel and the input detection unit adjacent to the second side, the organic material is maintained for a second delay time in the delay operation, wherein the first delay time is longer than the second delay time.

In an embodiment of the present inventive concept, the forming of the encapsulation layer further includes pre-curing the applied organic material before the delay operation.

In an embodiment of the present inventive concept, the display panel includes a dam structure disposed adjacent to the first side and the second side in the preparing of the display panel, wherein the applied organic material is in contact with a side surface of the dam structure in the delay operation.

In an embodiment of the present inventive concept, an organic encapsulation layer covering the light emitting element is formed after the curing of the organic material, wherein based on a contact point, at which the organic encapsulation layer and the side surface of the dam structure contact each other, a first angle formed by the organic encapsulation layer with respect to an upper surface of the base layer in the first part is less than a second angle formed by the organic encapsulation layer with respect to the upper surface of the base layer in the second part.

BRIEF DESCRIPTION OF THE DRAWINGS

The above and other features of the present inventive concept will become more apparent by describing in detail embodiments thereof with reference to the accompanying drawings, in which:

FIGS. 5A and 5B are each a cross-sectional view of a display module according to an embodiment of the present inventive concept;

DETAILED DESCRIPTION OF EMBODIMENTS

Figure 1A:
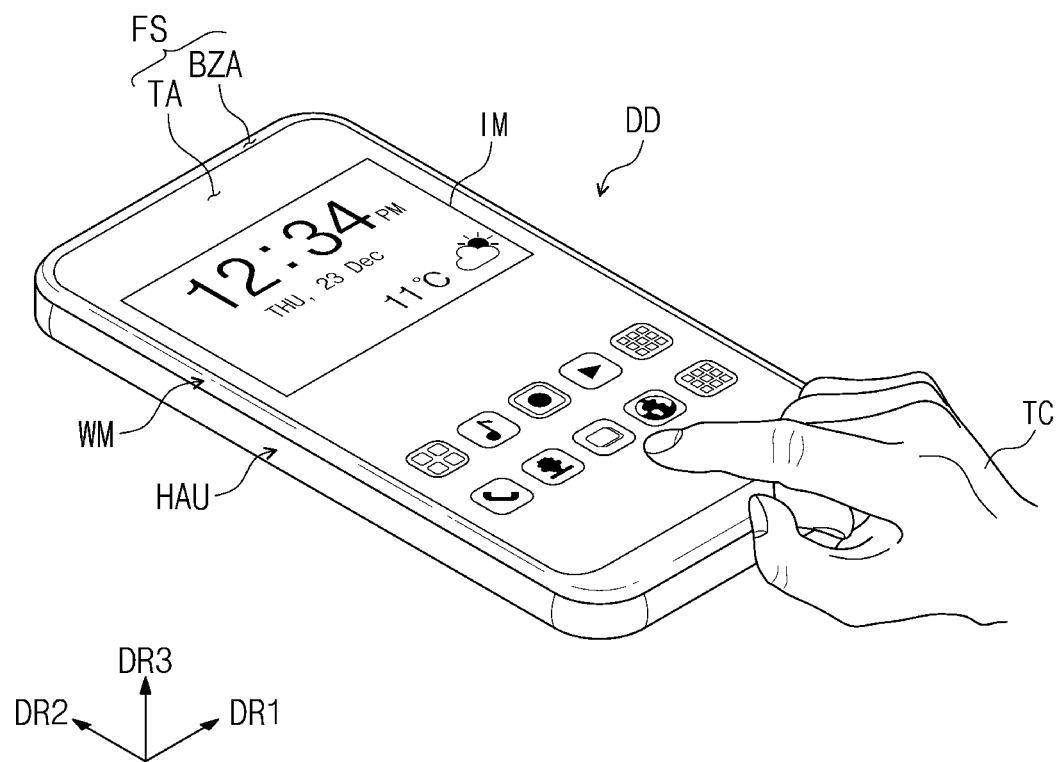
FIG. 1A is a combined perspective view of a display device according to an embodiment of the present inventive concept.

Hereinafter, embodiments of the present inventive concept will be described with reference to the drawings.

In this specification, when an element (or region, layer, part, etc.) is referred to as being "on", "connected to", or "coupled to" another element, the element may be directly placed on, connected to, or coupled to other components, or a third component may be arranged between them.

Like reference numerals may refer to like elements. Additionally, in the drawings, the thicknesses, proportions, and dimensions of components may be exaggerated for clarity. "And/or" includes any and all combinations that the associated configurations can define.

It will be understood that the terms "first" and "second" are used herein to describe various components but these components should not be limited by these terms. The above terms are used only to distinguish one component from another. For example, a first component may be referred to as a second component and vice versa without departing from the scope of the present inventive concept. The terms of a singular form may include plural forms unless otherwise specified.

In addition, terms such as "below", "the lower side", "on", and "the upper side" are used to describe a relationship of configurations shown in the drawing. It will be understood that the spatially relative tetras are intended to encompass different orientations of the device in use or operation in addition to the orientation depicted in the figures. For example, if the device in the figures is turned over, components described as "below" or "beneath" other components or features would then be oriented "above" the other components or features. The terms are described as a relative concept based on a direction shown in the drawing.

Meanwhile, in the present specification, "directly disposed" may mean that there is no layer, film, region, plate, and the like added between a portion such as a layer, film, region, or plate and another portion. For example, "directly disposed" may mean that an additional member such as an adhesive member is not disposed between two layers or members.

Hereinafter, a display device and a method of manufacturing the same according to an embodiment of the present inventive concept will be described with reference to the drawings.

Figure 1B:
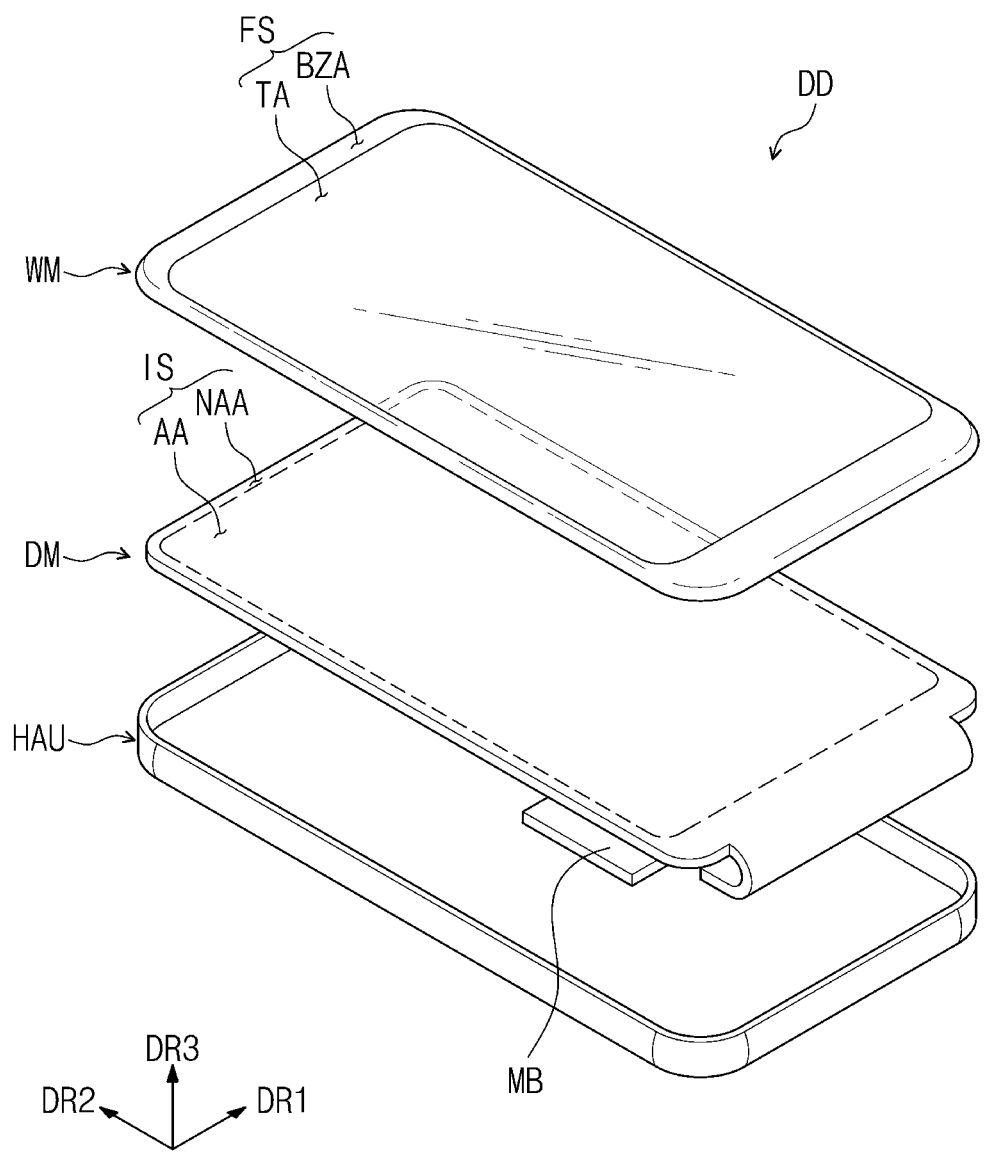
FIG. 1B is an exploded perspective view of a display device according to an embodiment of the present inventive concept.

FIG. 1A is a combined perspective view of a display device according to an embodiment of the present inventive concept. FIG. 1B is an exploded perspective view of a display device according to an embodiment of the present inventive concept. The present inventive concept will be described with reference to FIGS. 1A and 1B.

The display device DD may be a device that is activated according to an electrical signal. The display device DD may display the image IM and sense the external input TC. The display device DD may include various embodiments. For example, the display device DD may include a tablet, a notebook computer, a computer, and a smart television. In this embodiment, the display device DD is illustrated as a smart phone as an example, and the present inventive concept is not limited thereto.

The display device DD may display the image IM on the display surface FS toward the third direction DR3. The display surface FS may be parallel to each of the first and second directions DR1 and DR2. The third direction DR3 may be substantially perpendicular to the first and second directions DR1 and DR2, and the first and second directions DR1 and DR2 may intersect each other. The display surface FS on which the image IM is displayed may correspond to the front surface of the display device DD and may correspond to the front surface FS of the window member WM. Hereinafter, the same reference numerals are used for the display surface and the front surface of the display device DD, and the front surface of the window member WM. The image IM ay include a still image as well as a dynamic image. As an example of the image IM in FIG. 1A, a clock and a plurality of icons are illustrated.

In this embodiment, the front (or upper) surface and the rear (or lower) surface of each member are defined based on the direction in which the image IM is displayed. The front and rear surfaces are opposing to each other in the third direction DR3, and a normal direction of each of the front and rear surfaces may be parallel to the third direction DR3. For example, a separation distance between the front surface and the rear surface in the third direction DR3 may correspond to a thickness of the display panel DP in the third direction DR3; however, the present inventive concept is not limited thereto. Moreover, the directions indicated by the first to third directions DR1, DR2, and DR3 are relative concepts and may be converted to other directions.

The display device DD according to an embodiment of the present inventive concept may sense the user's input TC applied from the outside. The user's input TC includes various types of external inputs such as part of the user's body, light, heat, or pressure. In this embodiment, the user's input TC is shown as the user's hand applied to the front surface. However, this is shown as an example, as described above, the user's input TC may be provided in various forms, and in addition, the display device DD may detect the user input TC applied to the side or rear surface of the display device DD according to the structure of the display device DD, and present the inventive concept is not limited thereto.

As shown in FIGS. 1A and 1B, the display device DD includes a window member WM, a display module DM, and an outer case HAU. In the present embodiment, the window member WM and the outer case HAU are coupled to each other to form an appearance of the display device DD. In this embodiment, the outer case HMI, the display module DM, and the window member WM may be sequentially stacked along the third direction DR3.

The window member WM may include an insulating panel. For example, the window member WM may be made of glass, plastic, or a combination thereof.

As described above, the front surface FS of the window member WM may be the front surface of the display device DD. The transmission area TA may be an optically transparent area. For example, the transmission area TA may be an area having a visible light transmittance of about 90% or more.

The bezel area BZA may be an area having relatively low light transmittance compared to that of the transmission area TA. The bezel area BZA defines the shape of the transmission area TA. The bezel area BZA is adjacent to the transmission area TA, and may at least partially surround the transmission area TA.

The bezel area BZA may have a predetermined color. The bezel area BZA may cover the peripheral area NAA of the display module DM to block the peripheral area NAA from being visually recognized from the outside. In addition, this is illustrated by way of example, and in the window member WM according to an embodiment of the present inventive concept, the bezel area BZA may be omitted.

The display module DM may display the image IM and sense the external input TC. The image IM may be displayed on the front surface IS of the display module DM. The front surface IS of the display module DM includes an active area AA and a peripheral area. NAA. The active area AA may be an area activated according to an electrical signal.

In this embodiment, the active area AA is an area in which the image IM is displayed, and may be an area in which an external input TC is detected. The transmission area TA may overlap at least the active area AA. For example, the transmission area TA may overlap the entire surface or at least a part of the active area AA. Accordingly, the user may visually recognize the image IM through the transmission area TA or provide an external input TC. However, this is illustrated as an example, and in the active area AA, an area in which the image IM is displayed and an area in which an external input TC is detected may be separated from each other. This is not limited to any one embodiment.

The peripheral area NAA may be an area covered by the bezel area BZA. The peripheral area NAA is adjacent to the active area AA. The peripheral area NAA may at least partially surround the active area AA. A driving circuit or a driving wire for driving the active area AA may be disposed in the peripheral area NAA.

The display module DM may include a display panel and an input detection unit. The image IM may be displayed on the display panel, and the external input TC may be detected by the input detection unit. Since the display module DM includes both a display panel and an input detection unit, the display module DM may detect the external input TC While displaying the image IM. A detailed description of this will be described later.

At least a portion of the display module DM may be bent. In the present embodiment, portion of the display module DM to which the circuit board MB is connected is bent toward the rear surface of the display module DM, so that the circuit board MB may be assembled to overlap the rear surface of the display module DM.

In addition, the display device DD may further include a circuit board MB connected to the display module DM. The circuit board MB is coupled to one side of the display module DM to be physically and electrically connected to the display module DM. The circuit board MB generates an electrical signal to the display module DM or receives the signal generated by the display module DM to calculate the result value including information on the position of where the external input TC is sensed or the intensity thereof.

The outer case HAU is coupled to the window member WM to provide an appearance of the display device DD. The outer case HAU provides a predetermined inner space. The display module DM may be accommodated in the inner space.

Figure 2:
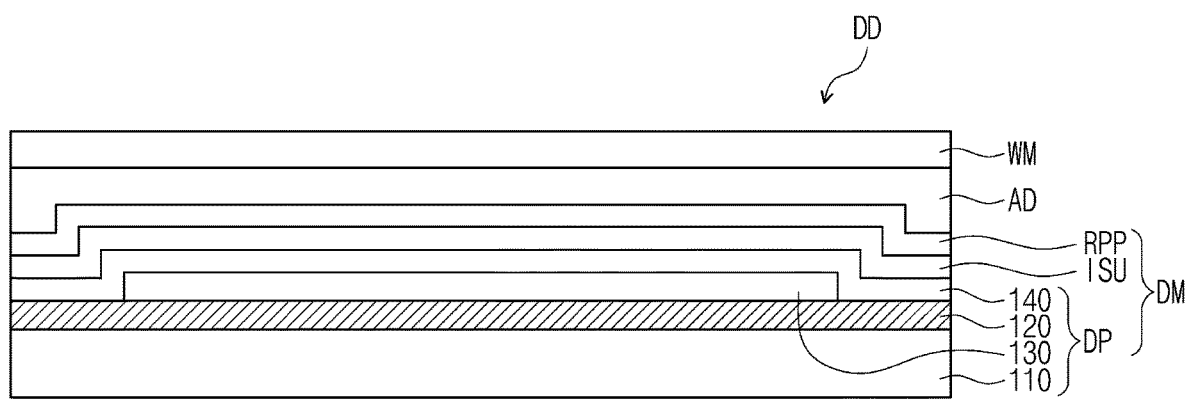
FIG. 2 is a cross-sectional view of a display device according to an embodiment of the present inventive concept.
Figure 2:
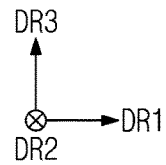

The outer case HAU may include a material having a relatively high rigidity. For example, the outer case RAU may include a plurality of frames and/or plates made of glass, plastic, or metal, or a combination thereof. The outer case HAU may stably protect the components of the display device DD accommodated in the inner space from external impact, FIG. 2 is a cross-sectional view of a display device according to an embodiment of present the inventive concept. Referring to FIG. 2, the display device DI) may include a display panel DP, an input detection unit ISU, an anti-reflector RPP, and a window member WM.

The display panel DP may be a light emitting display panel, and for example, the display panel DP may be an organic light emitting display panel, an inorganic light emitting display panel, a micro LED display panel, or a nano LED display panel. The display panel DP may include a base layer 110, a circuit layer 120, a light emitting element layer 130, and an encapsulation layer 140.

The base layer 110 may provide a base surface on which the circuit layer 120 is disposed. The base layer 110 may be a rigid substrate or a flexible substrate capable of bending, folding, rolling, or the like. The base layer 110 may be, for example, a glass substrate, a metal substrate, or a polymer substrate. However, embodiments of the present inventive concept are not limited thereto, and the base layer 110 may include an inorganic layer, an organic layer, or a composite material layer.

The base layer 110 may have a multilayer structure. For example, the base layer 110 may include a first synthetic resin layer, a multi- or single-layer inorganic layer, and a second synthetic resin layer disposed Oil the multi- or single-layer inorganic layer. Each of the first and second synthetic resin layers may include a polyimide-based resin, and is not particularly limited thereto.

The circuit layer 120 may be disposed on the base substrate 110. The circuit layer 120 may include an insulating layer, a semiconductor pattern, a conductive pattern, and a signal line. The circuit layer 120 includes a driving circuit of a pixel PX (refer to FIG. 3) to be described later.

The light emitting element layer 130 may be disposed on the circuit layer 120. The light emitting element layer 130 may include a light emitting element of a pixel PX (refer to FIG. 3) to be described later. For example, the light emitting element may include an organic light emitting material, an inorganic, light emitting material, an organic-inorganic light emitting material, a quantum dot, a quantum rod, a micro LED, or a nano LED.

The encapsulation layer 140 may be disposed on the light emitting element layer 130. The encapsulation layer 140 may protect the light emitting element layer 130 from foreign substances such as moisture, oxygen, and dust particles. The encapsulation layer 140 may include at least one inorganic layer. The encapsulation layer 140 may include a stacked structure of inorganic layers/organic layers/inorganic layers.

The input detection unit ISU may be disposed on the display panel DP. An input detection unit ISU may detect an external input applied from the outside. The external input may be a user's input. The user's input may include various types of external inputs such as a part of the user's body, light, heat, pen, or pressure.

The input detection unit ISU may be formed on the display panel DP through a continuous process. In this case, the input detection unit ISU may be directly disposed on the display panel DP. In this specification, "the component B is directly disposed on the component A" may mean that a third component is not disposed between the component A and the component B. For example, an adhesive layer may not be disposed between the input detection unit ISU and the display panel DP.

An anti-reflector RPP may be disposed on an input detection unit ISU. The anti-reflector RPP may reduce the reflectance of external light. For example, the anti-reflector RPP may be placed directly on the input detection unit ISU through a continuous process.

The anti-reflector RPP may include a light blocking pattern overlapping the reflective structure disposed under the anti-reflector RPP. The anti-reflector RPP may further include a color filter overlapping an emission area to be described later. The color filter may include a first color filter, a second color filter, and a third color filter corresponding to the first color pixel, the second color pixel, and the third color pixel, respectively.

The window member WM is disposed on the anti-reflector RPP. The window member WM and the anti-reflector RPP may be coupled to each other by an adhesive layer AD. The adhesive layer AD may be a pressure sensitive adhesive film (PSA) or an optically clear adhesive (OCA).

The window member WM includes at least one base layer. The base layer may be, for example, a glass substrate or a synthetic resin film. The window member WM may have a multi-layer structure. The window member WM may include a thin glass substrate and a synthetic resin film disposed on the thin glass substrate. The thin glass substrate and the synthetic resin film may be bonded to each other by an adhesive layer, and the adhesive layer and the synthetic resin film may be separated from the thin glass substrate for their replacement.

In an embodiment of the present inventive concept, the adhesive layer AD may be omitted, and the window member WM may be directly disposed on the anti-reflector RPP. An organic, inorganic, or ceramic material may be coated on the anti-reflector RPP.

Figure 3:
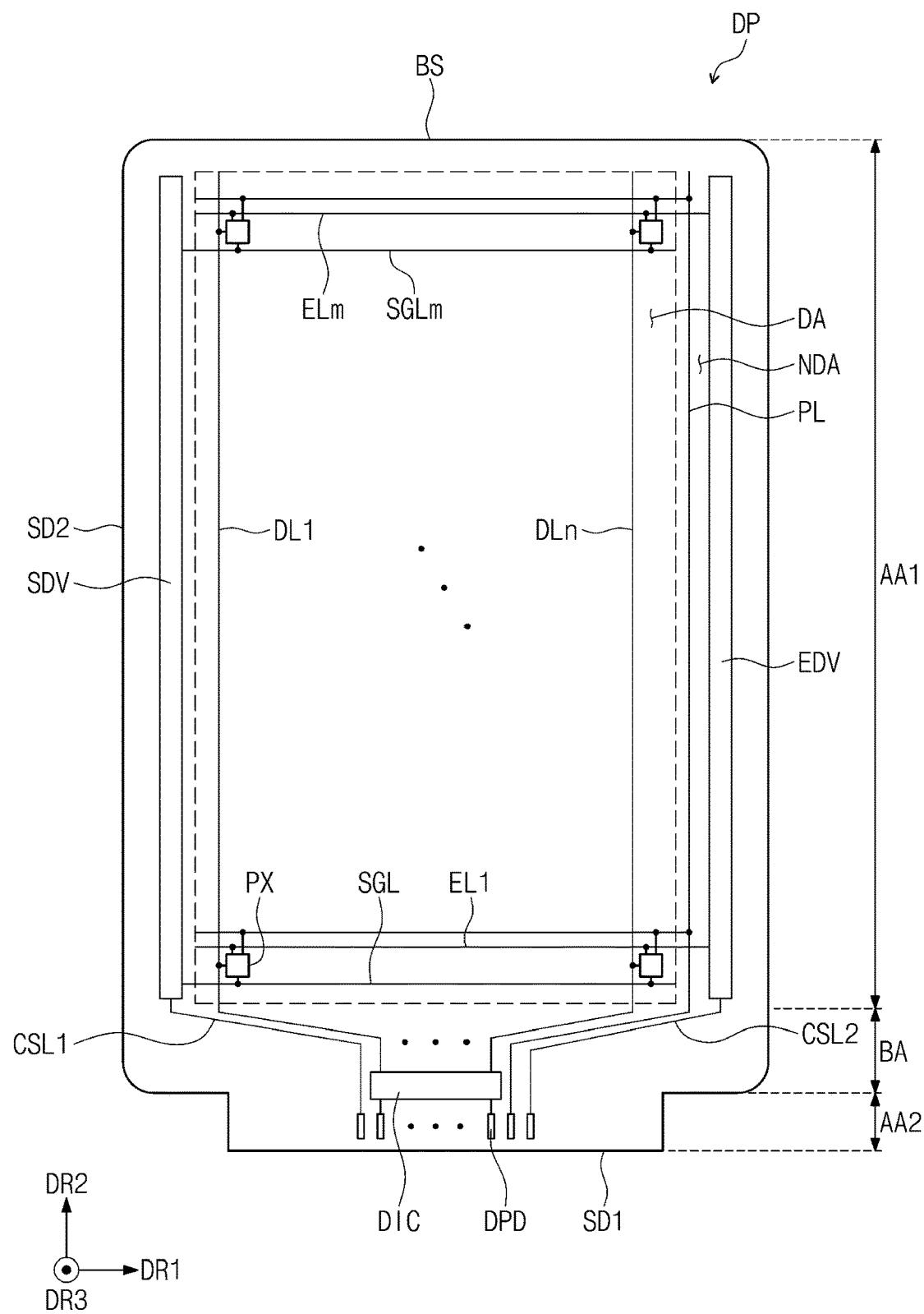
FIG. 3 is a plan view of a display panel according to an embodiment of the present inventive concept.
Figure 4A:
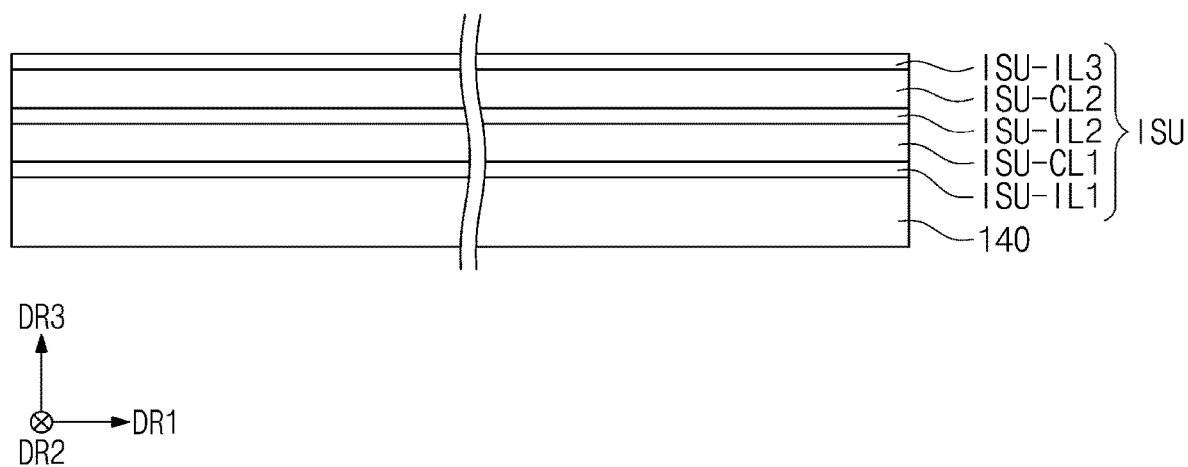
FIG. 4A is a cross-sectional view of an input detection unit according to an embodiment of the present inventive concept.
Figure 4B:
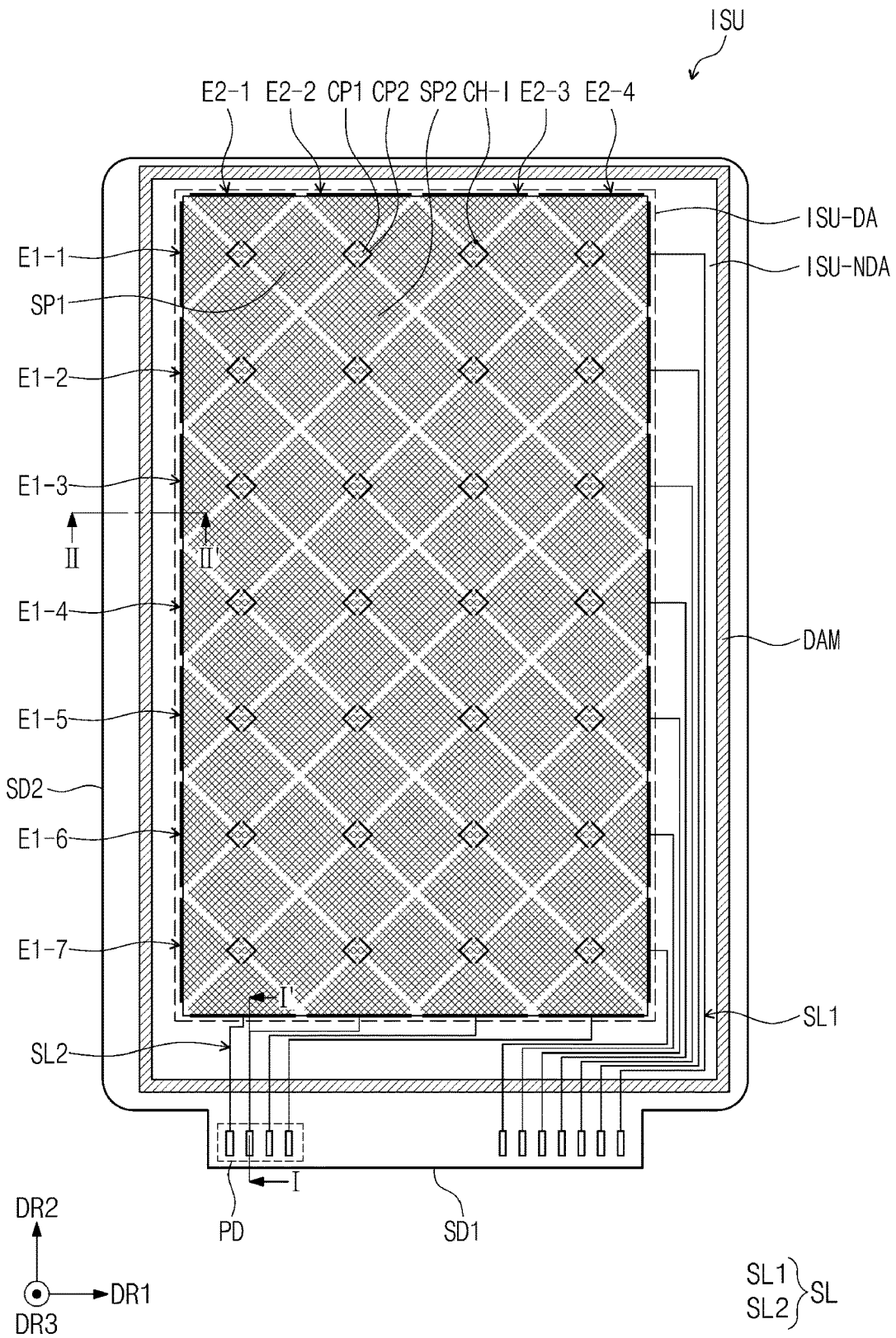
FIG. 4B is a plan view of an input detection unit according to an embodiment of the present inventive concept.

FIG. 3 is a plan view of a display panel according to an embodiment of the present inventive concept. FIG. 4A is a cross-sectional view of an input detection unit according to an embodiment of the present inventive concept. FIG. 4B is a plan view of an input detection unit according to an embodiment of the present inventive concept. Hereinafter, a display module DM according to an embodiment of the present inventive concept will be described with reference to FIGS. 3, 4A and 4B.

Referring to FIGS. 2, 3, 4A, and 4B together, the display module DM may include a display panel DP and an input detection unit ISU. The display panel DP generates an image IM. FIG. 3 is a plan view showing some of the components of the display panel DP.

In FIG. 3, some components of the display panel DP are illustrated in block form for easy explanation and clarity. Referring to FIG. 3, the display panel DP may include a base layer 110, a scan driving circuit SDV, an emission driving circuit EDV, a driving chip DIC, a plurality of panel signal lines SGL1 to SGLm, DL1 to DLn, EL1 to ELm, CSL1, CSL2, and PL, a plurality of pixels PX, and a plurality of display pads DPD.

The base layer 110 includes a first base area AA1, a second base area AA2, and a bending area BA arranged in the second direction DR2. The second base area AA2 and the bending area BA may be a partial area of the non-display area NDA. The bending area BA is disposed between the first base area AA1 and the second base area AA2.

The first base area AM may be an area including the front surface IS of FIG. 1B. The second base area AA2 is spaced apart from the first base area AA1 with the bending area BA therebetween. The second base area AA2 and the bending area BA may have a narrower width in the first direction DR1 than the first base area AA1. For example, widths of portions of the bending area BA and the second base area AA2 in the first direction DR1 may be less than the widths of the first base area AA1. However, the present inventive concept is not limited thereto. For example, the width of the bending area BA may be substantially the same as that of the first bending area AA1, and the width of the second base area AA2 may be less than that of each of the first bending area AA1 and the bending area BA.

An area with a short length in the direction of the bending axis may be bent more easily. However, this is illustrated by way of example, and the second base area AA2 and the bending area BA may have the same width as the first base area AAI in the first direction DR1. However, the present inventive concept is not limited thereto.

The bending area BA is bent about a bending axis extending in the first direction DR1. When the bending area BA of the second base area AA2 is not bent, it may face in the same direction as the first base area AA1, and when the bending area BA is bent, it may face in a direction opposite to the first base area AA1.

The above-described circuit board MB (refer to FIG. 1B) is physically connected to the second base area AA2. As the bending area BA is bent, the circuit board MB is positioned on the rear surface of the electronic panel. Accordingly, the area defining the front surface IS becomes the first base area AA1, and the second base area AA2 and the bending area BA are not viewed through the front surface IS. Accordingly, the bezel area of the electronic device may be reduced.

Each of the pixels PX includes a light emitting element and a thin film transistor connected to the light emitting element. The shape of the display panel DP shown in FIG. 3 is substantially the same as that of the above-described base layer in plan view. In the present embodiment, the display area DA and the non-display area NDA may be divided according to whether or not the light emitting element is disposed.

In FIG. 3, the pixels PX are illustrated as being disposed in the display area DA. The display area DA may be an area in which the image is displayed. Moreover, this is shown as an example, and some of the components of each of the pixels PX may include a thin film transistor disposed in the non-display area NDA, and this is not limited to any one embodiment.

The scan driving circuit SDV, the driving chip DIC, and the emission driving circuit EDV may be disposed in the non-display area NDA. The driving chip DIC may include a data driving circuit.

The panel signal lines SGL to SGLm, DL1 to DLn, EL1 to Elm, CSL1, CSL2, and PL may include a plurality of scan lines SGL to SGLm, a plurality of data lines DL1 to DLn, a plurality of emission lines EL1 to Elm, first and second control lines CSL1 and CSL2, and a power line PL. Among the panel signal lines SGL1 to SgLm, DL1 to DLn, EL1 to Elm, CSL1, CSL2, and PL, the data lines DL1 to DLn, the first and second control lines CSL1 and CSL2, and the power line PL may be connected to the plurality of display pads DPD, respectively. Here, in and n are natural numbers. The pixels PX may be connected to the scan lines SGL1 to SGLm, the data lines DL1 to DLn, and the emission lines EL1 to Elm.

The scan lines SGL1 to SGLm may extend in the second direction DR2 to be connected to the scan driving circuit SDK The data lines DU to DLn may extend in the second direction DR2 and may be connected to the driving chip DIC through the bending area BA. The emission lines EL1 to Elm may extend in the first direction DR1 to be connected to the emission driving circuit EDV.

The power line PL may include a portion extending in the second direction DR2 and a portion extending in the first direction DR1. The portion extending in the first direction DR1 and the portion extending in the second direction DR2 may be disposed on different layers; however, the present inventive concept is not limited thereto. A portion of the power line PL extending in the second direction DR2 may extend to the second base area AA2 through the bending area BA. The power line PL may provide a first voltage to the pixels PX.

The first control line CSL1 may be connected to the scan driving circuit SDV and may extend toward a lower end of the second base area AA2 through the bending area BA. The second control line CSL2 may be connected to the emission driving circuit EDV and may extend toward a lower end of the second base area AA2 via the bending area BA.

When viewed in a plan view, the display pads DPD may be disposed adjacent to a lower end of the second base area AA2. The driving chip DIC, the power line PL, the first control line CSL1, and the second control line CSL2 may be connected to the display pads DPD. A circuit board MB may be electrically connected to the display pads DPD through an anisotropic conductive adhesive layer.

Referring to FIG. 4A, the input detection unit ISU may include a first detection insulating layer ISU-IL1 (or, e.g., a base insulating layer), a first conductive pattern layer ISU-CL1, a second detection insulating layer ISU-IL2 (or, e.g., an intermediate insulating layer), a second conductive pattern layer ISU-CL2, and a third detection insulating layer ISU-IL3 (or, e.g., a cover insulating layer). The first detection insulating layer may be directly disposed on the encapsulation layer 140.

In an embodiment of the present inventive concept, the first detection insulating layer ISU-IL1 and/or the third detection insulating layer ISU-IL3 may be omitted. When the first detection insulating layer ISU-IL1 is omitted, the first conductive pattern layer ISU-CL1 may be disposed on the uppermost insulating layer of the encapsulation layer 140. The third detection insulating layer ISU-IL3 may be replaced with an adhesive layer or an insulating layer of an anti-reflector RPP disposed on the input detection unit ISU.

The first conductive pattern layer ISU-CL1 may include first conductive patterns, and the second conductive pattern layer ISU-CL2 may include second conductive patterns. Hereinafter, the first conductive pattern layer ISU-CL1 and the first conductive patterns are denoted by the same reference numerals, and the second conductive pattern layer ISU-CL2 and the second conductive patterns are denoted by the same reference numerals.

Each of the first conductive patterns ISU-CL1 and the second conductive patterns ISU-CL2 may have a single-layer structure or a multi-layer structure stacked along the third direction DR3. The conductive pattern of the multi-layer structure may include at least two or more of transparent conductive layers and metal layers. The conductive pattern of the multi-layer structure may include metal layers including different metals. The transparent conductive layer may include, for example, indium tin oxide (ITO) indium zinc oxide (IZO), zinc oxide (ZnO), indium tin zinc oxide (ITZO), PEDOT, metal nanowires, or graphene. The metal layer may include, for example, molybdenum, silver, titanium, copper, aluminum, or an alloy thereof. A detailed description of the stacked structure of each of the first conductive pattern layer ISU-CL1 and the second conductive pattern layer ISU-CL2 will be described later.

In this embodiment, each of the first detection insulating layer ISU-IL1 to the third detection insulating layer ISU-IL3 may include an inorganic layer or an organic layer. In this embodiment, the first detection insulating layer ISU-IL1 to the third detection insulating layer ISU-IL3 may include an inorganic layer. The inorganic layer may include silicon oxide, silicon nitride, or silicon oxy nitride.

In an embodiment of the present inventive concept, at least one of the first detection insulating layer ISU-IL1 to the third detection insulating layer ISU-IL3 may be an organic layer. For example, the third detection insulating layer ISU-IL3 may include an organic layer. The organic layer may include at least one of, for example, acrylic resin, methacrylic resin, polyisoprene, vinyl resin, epoxy resin, urethane resin, cellulose resin, siloxane resin, polyimide resin, polyamide resin, or perylene resin.

Referring to FIG. 4B, the input detection unit ISU includes a detection area ISU-DA and a non-detection area ISU-NDA adjacent to the detection area ISU-DA. The detection area ISU-DA and the non-detection area ISU-NDA respectively correspond to the display area DA (refer to FIG. 3) and the non-display area NDA (refer to FIG. 3) shown in FIG. 3.

The input detection unit ISU is disposed in the detection area ISU-DA, and includes first electrodes E1-1 to E1-7 and second electrodes E2-1 to E2-4 that are insulated from each other and cross each other. The input detection unit ISU includes signal lines SL disposed in the non-detection area ISU-NDA. The signal lines SL may include first group signal lines SL1 and second group signal lines SL2. The first group signal lines SL1 may be electrically connected to the first electrodes E1-1 to E1-7, and the second group signal lines SL2 may be electrically connected to the second electrodes E2-1 to E2-4. As a combination of the first conductive patterns ISU-CL1 and the second conductive patterns ISU-CL2 described with reference to FIG. 4A, the first electrodes E1-1 to E1-7, the second electrodes E2-1 to E2-4, the first group signal lines SL1, and the second group signal lines SL2 may be provided.

Each of the first electrodes E1-1 to E1-7 and the second electrodes E2-1 to E2-4 may include a plurality of conductive lines crossing each other. A plurality of conductive lines define a plurality of opening, and each of the first electrodes E1-1 to E1-7 and the second electrodes E2-1 to E2-4 may have a mesh shape. Each of the plurality of opening may correspond to an emission area of the display panel DP.

Any one of the first electrodes E1-1 to E1-7 and the second electrodes E2-1 to E2-4 may have an integral shape. In this embodiment, the first electrodes E1-1 to E1-7 having an integral shape are as an example. The first electrodes E1-1 to E1-7 may include a detection electrode SP1 and middle portions CP1. Some of the above-described second conductive patterns ISU-CL2 may correspond to the first electrodes E1-1 to E1-7.

Each of the second electrodes E2-1 to E2-4 may include detection electrodes SP2 and bridge patterns CP2 (or connection patterns). The two adjacent detection electrodes SP2 may be connected to the two bridge patterns CP2 through the contact hole CH-I penetrating the second detection insulating layer ISU-IL2 (refer to FIG. 3), but the number of bridge patterns is not limited. Some of the above-described second conductive pate s ISU-CL2 may correspond to the detection electrodes SP2. Some of the above-described first conductive patterns ISU-CL1 may correspond to the bridge patterns CP2.

In this embodiment, it has been described that the bridge patterns CP2 are formed from the first conductive patterns ISU-CL1 shown in FIG. 4A, and the first electrodes E1-1 to E1-7 and the detection electrodes SP2 are formed from the second conductive patterns ISU-CL2, but the embodiment of the present inventive concept is not limited thereto. The first electrodes E1-1 to E1-7 and the detection electrodes SP2 may be formed from the first conductive patterns ISU-CL1 shown in FIG. 3, and the bridge patterns CP2 may be formed from the second conductive patterns ISU-CL2.

Any one of the first group signal lines SL1 and the second group signal lines SL2 transmits a transmission signal for sensing an external input from an external circuit, and the other transmits a change in capacitance between the first electrodes E1-1 to E1-7 and the second electrodes E2-1 to E2-4 as a reception signal to an external circuit. Each of the first group signal lines SU and the second group signal lines SL2 is connected to the detection pad PD, and may receive a transmission signal transmitted from an external circuit from the detection pad PD, or transmit a change in capacitance between the first electrodes E1-1 to E1-7 and the second electrodes E2-1 to E2-4 to an external circuit through the detection pad PD. The detection pads PD may be disposed at a portion corresponding to a lower portion of the second base area AA2 of the display panel DP when viewed in a plan view. The above-described circuit board MB (refer to FIG. 1B) may be electrically connected to the detection pads PD through an anisotropic conductive adhesive layer.

Some of the above-described second conductive patterns ISU-CL2 may correspond to the first group signal lines SL1 and the second group signal lines SL2. The first group signal lines SL1 and the second group signal lines SL2 have a multilayer structure, and includes a first layer line formed from the aforementioned first conductive patterns ISU-CL1 and a second layer line formed from the aforementioned second conductive patterns ISU-CL2. The first layer line and the second layer line may be connected to each other through a contact hole penetrating the second detection insulating layer ISU-IL2 (refer to FIG. 4A).

Referring to FIGS. 3, 4A, and 4B together, the display device according to an embodiment of the present inventive concept further includes a dam structure DAM overlapping the non-detection area ISU-NDA. The dam structure DAM is a configuration included in the display panel. DP due to an arrangement relationship, but for convenience of description, an arrangement relationship with components included in the input detection unit ISU is illustrated in FIG. 4B. The dam structure DAM may be disposed on the base layer 110 (refer to FIG. 2) of the aforementioned display panel DP. As shown in FIG. 4B, the dam structure DAM may overlap the non-detection area ISU-NDA and might not overlap the detection area ISU-DA. The dam structure DAM is disposed on the non-display area NDA and may be disposed to at least partially surround the display area DA.

In addition, referring to FIGS. 3 and 4B, each of the display panel DP and the input detection unit ISU may include a first side SIM extending in the first direction DR1 and a second side SD2 extending in the second direction DR2. In the present embodiment, the first side SD1 is a side where the display pads DPD and the detection pads PD are disposed adjacent to each other, and the second side SD2 may be adjacent to the first side SD1 and may be a side extending from the first side SDI in the second direction DR2. For example, the display pads DPD and the detection pads PD may be disposed adjacent to the first side SD1.

Figure 5B:
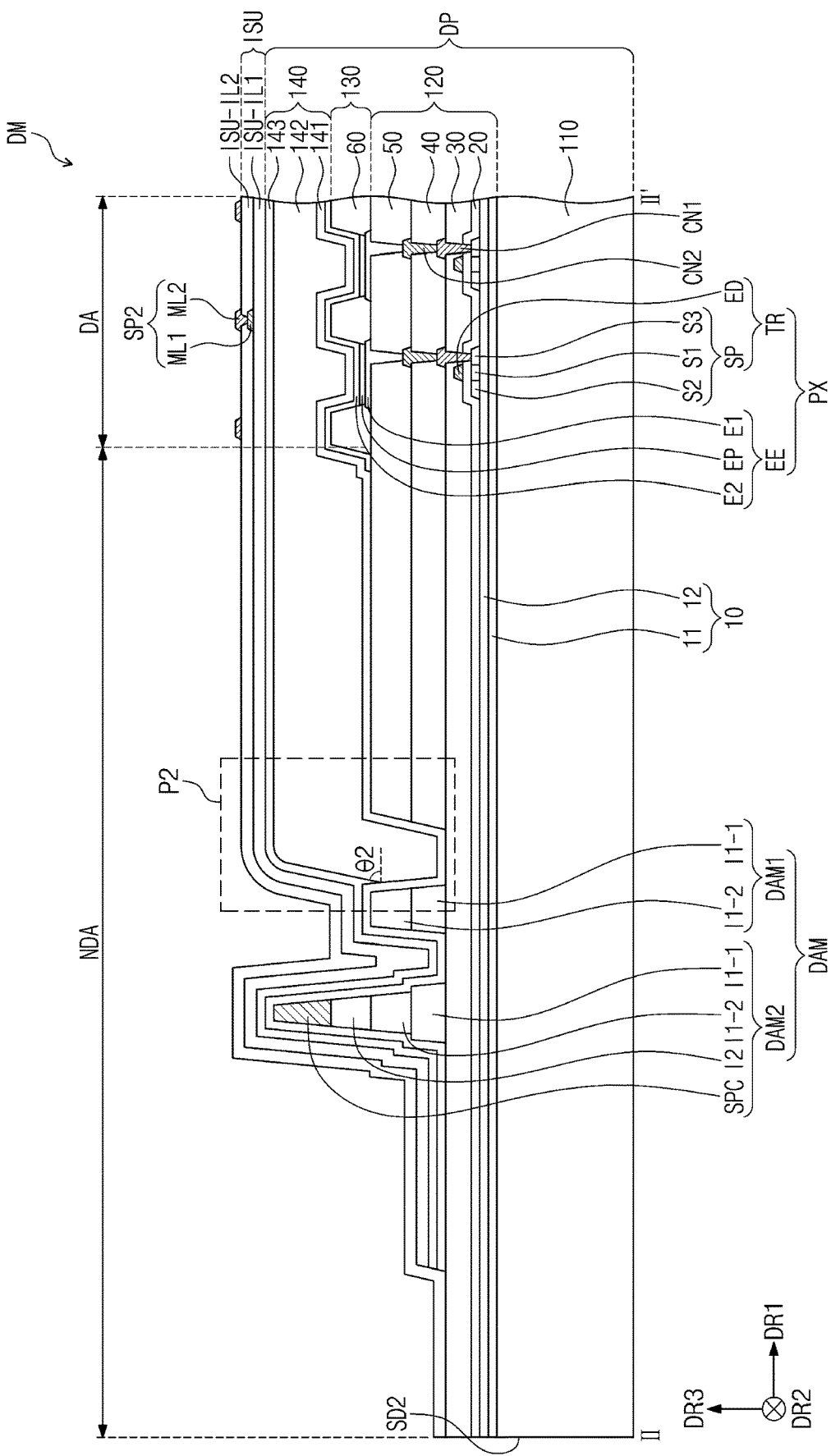

FIGS. 5A and 5B are each a cross-sectional view of a display module according to an embodiment of the present inventive concept, FIG. 5A shows a cross-section taken along line I-I' shown in FIG. 4B. FIG. 5B shows a cross-section taken along line II-II' shown in FIG. 4B.

As shown in FIGS. 5A and 5B, in relation to the display module DM, the display panel DP and the input detection unit ISU may be stacked and provided. The display panel DP may include a base layer 110 and a plurality of insulating layers 10, 20, 30, 40, and 50 disposed on the base layer 110. Components constituting the pixel PX, the signal lines SGL1 to SGLm, DL1 to DLn, EL1 to Elm, CSL1, CSL2, and PL, and the scan driving circuit SDV may be disposed between the base layer 110 and the insulating layers 10, 20, 30, 40, and 50. Moreover, the plurality of insulating layers 10, 20, 30, 40, and 50 and components constituting the pixel PX, the signal lines SGL1 to SGLm, DL1 to DLn, EL1 to Elm, CSL1, CSL2, and PL, and the scan driving circuit SDV may be included in the circuit layer 120.

The base layer 110 has insulating properties. The base layer 110 may be flexible to be bendable. For example, the base layer 110 may be an insulating polymer film.

The first insulating layer 10 may be disposed on the base layer 110. The first insulating layer 10 may include a barrier layer 11 and a buffer layer 12. The barrier layer 11 may prevent foreign substances from being introduced from the outside. The barrier layer 11 may include at least one of a silicon oxide layer and/or a silicon nitride layer. Each of these may be provided in plurality, and silicon oxide layers and silicon nitride layers may be alternately stacked.

The buffer layer 12 may be disposed on the barrier layer 11. The buffer layer 12 may increase the bonding force between the base layer 110 and the semiconductor pattern and/or the conductive pattern. The buffer layer 12 may include at least one of a silicon oxide layer and a silicon nitride layer. The silicon oxide layer and the silicon nitride layer may be alternately stacked.

The pixels PX are disposed on the first insulating layer 10. FIGS. 4A and 4B exemplarily show some configurations of one pixel PX. The pixel. PX may include a transistor TR and a light emitting element EE.

The transistor TR may include a semiconductor pattern SP and a gate ED. The semiconductor pattern SP may be disposed on the first insulating layer 10. The semiconductor pattern SP may include a channel S1, a source S2, and a drain S3. The semiconductor pattern SP may include a silicon semiconductor, and may include a single crystal silicon semiconductor, a polysilicon semiconductor, or an amorphous silicon semiconductor. In addition, the semiconductor pattern SP may include an oxide semiconductor. The semiconductor pattern SP according to an embodiment of the present inventive concept may be formed of various materials as long as it has semiconductor properties, and the present inventive concept is not limited thereto.

The semiconductor pattern SP has different electrical properties depending on whether it is doped or not. The semiconductor pattern may include a doped area and a non-doped area. The doped area may be doped with an N-type dopant or a P-type dopant. The P-type transistor includes a doped area doped with a P-type dopant. The doped area is more conductive than the non-doped area, and may serve as an electrode or signal wire. The non-doped area substantially corresponds to the channel (or active) of the transistor. In other words, a portion of the semiconductor pattern SP may be the channel S1 of the transistor TR, another portion mazy be the source S2 or the drain S3 of the transistor TR, and another portion may be a connection signal wire (or a connection electrode).

The second insulating layer 20 is disposed on the first insulating layer 10 and may cover the semiconductor pattern SP. The second insulating layer 20 may be disposed between the semiconductor pattern SP and the gate ED of the transistor TR. The second insulating layer 20 may be an inorganic layer and/or an organic layer, and may have a single-layer or multi-layer structure. The second insulating layer 20 may include at least one of, for example, aluminum oxide, titanium oxide, silicon oxide, silicon oxynitride, zirconium oxide, and/or hafnium oxide. In this embodiment, the second insulating layer 20 may be a single-layer silicon oxide layer. The inorganic layer to be described later may include at least one of the aforementioned materials.

The gate ED may be disposed on the second insulating layer 20. For example, the gate ED may be a part of the metal pattern. In a plan view, the gate ED may overlap the channel S1. In the process of doping the semiconductor pattern SP, the gate ED may function as a mask.

The third insulating layer 30 is disposed on the second insulating layer 20 and may cover the gate ED. The third insulating layer 30 may be an inorganic layer and may have a single-layer or multi-layer structure. In this embodiment, the third insulating layer 30 may be a single-layer silicon oxide layer.

In addition, this is illustrated by way of example, and in relation to the transistor TR, the source S2 or the drain S3 may be electrodes independently formed from the semiconductor pattern SP. In this case, the source S2 and the drain. S3 may contact the semiconductor pattern SP or pass through the insulating layer (e.g., 20, 30, 40 and/or 50) to be connected to the semiconductor patterns SP. In addition, the gate ED may be disposed under the semiconductor pattern SP. The transistor TR according to an embodiment of the present inventive concept may be formed in various structures, and the present inventive concept is not limited thereto.

The fourth insulating layer 40 may be disposed on the third insulating layer 30. The fourth insulating layer 40 may be an organic layer, and may have a single-layer or multi-layer structure. For example, the fourth insulating layer 40 may be a single-layer polyimide resin layer. However, the embodiment of the present inventive concept is not limited thereto, and the fourth insulating layer 40 may include at least one of, for example, acrylic resin, methacrylic resin, polyisoprene, vinyl-based resin, epoxy-based resin, urethane-based resin, cellulose-based resin, siloxane-based resin, polyamide-based resin, and/or perylene-based resin. The organic layer to be described later may include at least one of the aforementioned materials.

The first connection electrode CN1 may be disposed on the third insulating layer 30, and the second connection electrode CN2 may be disposed on the fourth insulating layer 40. The first connection electrode CN1 may pass through the second insulating layer 20 and the third insulating layer 30 to be electrically connected to the semiconductor pattern SP. The second connection electrode CN2 may pass through the fourth insulating layer 40 to be electrically connected to the first connection electrode CN1.

In addition, at least one of the first connection electrode CN1 or the second connection electrode CN2 may be omitted. In addition, an additional connection electrode connecting the light emitting element EE and the transistor TR may be disposed. An electrical connection method between the light emitting element EE and the transistor TR may be variously changed according to the number of insulating layers disposed between the light emitting element EE and the transistor TR, and the embodiment of the present inventive concept is not limited thereto.

The fifth insulating layer 50 may be disposed on the fourth insulating layer 40 to cover the second connection electrode CN2. The fifth insulating layer 50 may be an organic layer or an inorganic layer, and may have a single-layer or multi-layer structure. In addition, the plurality of insulating layers 10, 20, 30, 40, and 50 and the transistor TR have a configuration corresponding to the circuit layer 120 described above with reference to FIG. 2. In addition, at least some of the upper surfaces of each of the plurality of insulating layers 10, 20, 30, 40, and 50 may have a substantially flat surface parallel to the upper surface of the base layer 110.

The light emitting element EE may be disposed on the fifth insulating layer 50. The light emitting element EE may include a first electrode E1, a light emitting layer EP, and a second electrode E2. The first electrode E1 may be electrically connected to the transistor TR through the first connection electrode CN1 and the second connection electrode CN2.

The sixth insulating layer 60 is disposed on the fifth insulating layer 50 and may expose at least a portion of the first electrode E1. Hereinafter, the sixth insulating layer 60 may be referred to as a pixel defining film in this specification. The pixel defining film 60 may include an inorganic layer, an organic layer, or a combination thereof, and may have a single-layer or multi-layer structure. In addition, in the present specification, the pixel defining film 60 and the light emitting element EE are components corresponding to the light emitting element layer 130 described above in FIG. 2.

The light emitting layer EP may be disposed on the first electrode E1. The light emitting layer EP may provide light of a predetermined color. Although the patterned single-layer light emitting layer EP has been exemplarily illustrated in this embodiment, the embodiment of the inventive concept is not limited thereto. For example, the light emitting layer EP may have a multi-layer structure. In addition, the light emitting layer EP may extend toward the upper surface of the pixel defining film 60 to be provided in common to a plurality of pixels.

The second electrode E2 may be disposed on the light emitting layer EP. An electronic control layer (or electronic control region) may be disposed between the second electrode E2 and the light emitting layer EP, and a hole control layer (or a hole control region) may be disposed between the first electrode E1 and the light emitting layer EP.

The encapsulation layer 140 is disposed on the pixel defining film 60 and may cover the light emitting element ER The encapsulation layer 140 may include at least one organic encapsulation layer. The encapsulation layer 140 may include a plurality of inorganic encapsulation layers and at least one organic encapsulation layer disposed between each of the plurality of inorganic encapsulation layers. In an embodiment of the present inventive concept, the encapsulation layer 140 may include a first inorganic encapsulation layer 141, an organic encapsulation layer 142, and a second inorganic encapsulation layer 143.

The first inorganic encapsulation layer 141 may be disposed on the second electrode E2. The organic encapsulation layer 142 may be disposed on the first inorganic encapsulation layer 141. The second inorganic encapsulation layer 143 is disposed on the organic encapsulation layer 142 and may cover the organic encapsulation layer 142. The first inorganic encapsulation layer 141 and the second inorganic encapsulation layer 143 may include, for example, a silicon nitride layer, a silicon oxynitride layer, a silicon oxide layer, a titanium oxide layer, an aluminum oxide layer, and the like, and the embodiment of the present inventive concept is not particularly limited thereto. The organic encapsulation layer 142 may include, for example, an acryl-based organic layer or a silicon-based organic layer, and the embodiment of the present inventive concept is not particularly limited thereto. The first inorganic encapsulation layer 141 and the second inorganic encapsulation layer 143 may protect the light emitting element EE from moisture/oxygen or foreign substances.

The display panel DP further includes a dam structure DAM disposed in the non-display area NDA. The dam structure DAM is disposed outside the display area DA to prevent overflow of the organic encapsulation layer 142. In an embodiment of the present inventive concept, the dam structure DAM may be disposed outside of the display module DM.

A plurality of dam structures DAM may be provided. The dam structure DAM may include a first dam structure DAM1 and a second dam structure DAM2. The first dam structure DAM1 and the second dam structure DAM2 are sequentially arranged in a direction away from the display area DA. For example, the second dam structure DAM2 is disposed to be more spaced apart from the display area DA compared to the first dam structure DAM1, and the first dam structure DAM1 may be disposed between the second dam structure DAM2 and the display area DA.

Each of the dam structures DAM1 and DAM2 may include a plurality of layers. In an embodiment of the present inventive concept, the first dam structure DAM1 may include a 1-1 layer I1-1 and a 1-2 layer I1-2, and the second dam structure DAM2 may include a 1-1 layer I1-1, a 1-2-th layer I1-2, and a second layer I2. The first dam structure DAM1 may have a lower height than the second dam structure DAM2. In the case of the first layer including the 1-1 layer I1-1 and the 1-2 layer I1-2, the first layer may be a layer corresponding to each of the fourth insulating layer 40 and the fifth insulating layer 50. For example, the 1-1 layer I1-1 includes the same material as the fourth insulating layer 40 and may be a layer formed by the same process. The 1-2 layer I1-2 may include the same material as the fifth insulating layer 50 and may be formed by the same process. The second layer 12 may be a layer corresponding to the pixel defining film 60. The second layer 12 includes same material as the pixel defining film. 60 and may be a layer formed by the same process. In addition, in the first dam structure DAM1, the 1-1 layer I1-1 and the 1-2 layer I1-2, and a portion of the first inorganic encapsulation layer 141 covering the upper and side surfaces thereof may be all included.

In the second dam structure DAM2, a spacer SPC may be disposed on the second layer 12. The spacer SPC is disposed on the uppermost portion of the second dam structure DAM2 to increase the height of the second dam structure DAM2, thereby preventing overflow of the organic encapsulation layer 142, and when a metal mask is disposed on the display module DM in a later process operation, the spacer SPC secures an interval between the metal mask and the lower element, thereby preventing a problem of the lower element being stamped by the metal mask. In addition, in the second dam structure DAM2, the 1-1 layer I1-1, the 1-2 layer I1-2, the second layer 12, and the spacer SPC, and a portion of the first inorganic encapsulation layer 141 covering the upper and side surfaces thereof are all included.

The input detection unit ISO may be disposed on the display panel DP. The input detection unit ISU may include a first conductive layer ML1, a second conductive layer ML2, a first detection insulating layer ISU-IL1, and a second detection insulating layer ISU-IL2. The second conductive layer ML2 is disposed on a layer different from which the first conductive layer ML1 is disposed on. The second conductive layer ML2 is disposed on the second detection insulating layer ISU-IL2. The second detection insulating layer ISU-IL2 is disposed on the first detection insulating layer ISU-IL1 to cover the first conductive layer ML1. In addition, the third detection insulating layer ISU-IL3 described above with reference to FIG. 4A may be disposed on the second conductive layer ML2.

At least one of the first conductive layer ML1 or the second conductive layer ML2 constitutes the detection electrode SP2. In this embodiment, the detection electrode SP2 may be a mesh-shaped pattern as described above, and is illustrated as including a first conductive layer ML1 and a second conductive layer ML2 connected to the first conductive layer ML1. However, this is illustrated by way of example, and the detection electrode SP2 may be a part of any one of the first conductive layer ML1 and the second conductive layer ML2. In addition, the detection electrode SP2 may be a single-shaped pattern overlapping a plurality of light emitting elements. In addition, the first conductive layer ML1 or the second conductive layer ML2 may include a transparent conductive oxide or an opaque metal, but the present inventive concept is not limited thereto.

Some of the first conductive layer ML1 and the second conductive layer ML2 may be signal lines SL (refer to FIG. 4B). For example, in this embodiment, it is shown that the signal lines SL (refer to FIG. 4B) include a plurality of layers disposed on the first detection insulating layer ISU-IL1 and the second detection insulating layer ISU-IL2. As shown in FIGS. 5A and 5B, the signal lines SL (refer to FIG. 4B) may have a double layer structure including a first signal line SL-1 disposed on a first detection insulating layer ISU-IL1 and a second signal line SL-2 disposed on a second detection insulating layer ISU-IL2. However, this is shown as an example, and at least some of the signal lines SL (refer to FIG. 4B) may correspond to only one of the first conductive layer ML1 and the second conductive layer ML2, and the embodiment of the present inventive concept is not limited thereto. Some of the first signal line SL-1 and the second signal line SL-2 may be connected to each other through a contact hole defined in the second detection insulating layer ISU-IL2. In addition, a detection pad PD (see FIG. 4B) may be disposed at the ends of the signal lines SL-1 and SL-2 shown in FIG. 5B to be electrically connected to the signal lines SL-1 and SL-2. The detection pad PD (refer to FIG. 4B) may be disposed on the third detection insulating layer, and may be connected to the signal lines SL-1 and SL-2 through a contact hole defined in the third detection insulating layer.

Referring to FIGS. 4B, 5A and 5B together, in the portion corresponding to the cut line I-I' of FIG. 4B, that is, the portion adjacent to the first side SD1, an end of the organic encapsulation layer 142 is disposed to form a first angle θ1 with respect to a plane parallel to the upper surface of the base layer 110. In the portion corresponding to the cut line of FIG. 4B, that is, the portion adjacent to the second side SD2, an end of the organic encapsulation layer 142 is disposed to form a second angle θ2 with respect to a plane parallel to the upper surface of the base layer 110. Hereinafter, in the present specification, a portion adjacent to the first side SD1 is referred to as a first part P1, and a portion adjacent to the second side SD2 is referred to as a second part P1 Hereinafter, a shape of the organic encapsulation layer 142 that is disposed in the first part P1 and the second part P2 will be described in more detail.

Figure 6A:
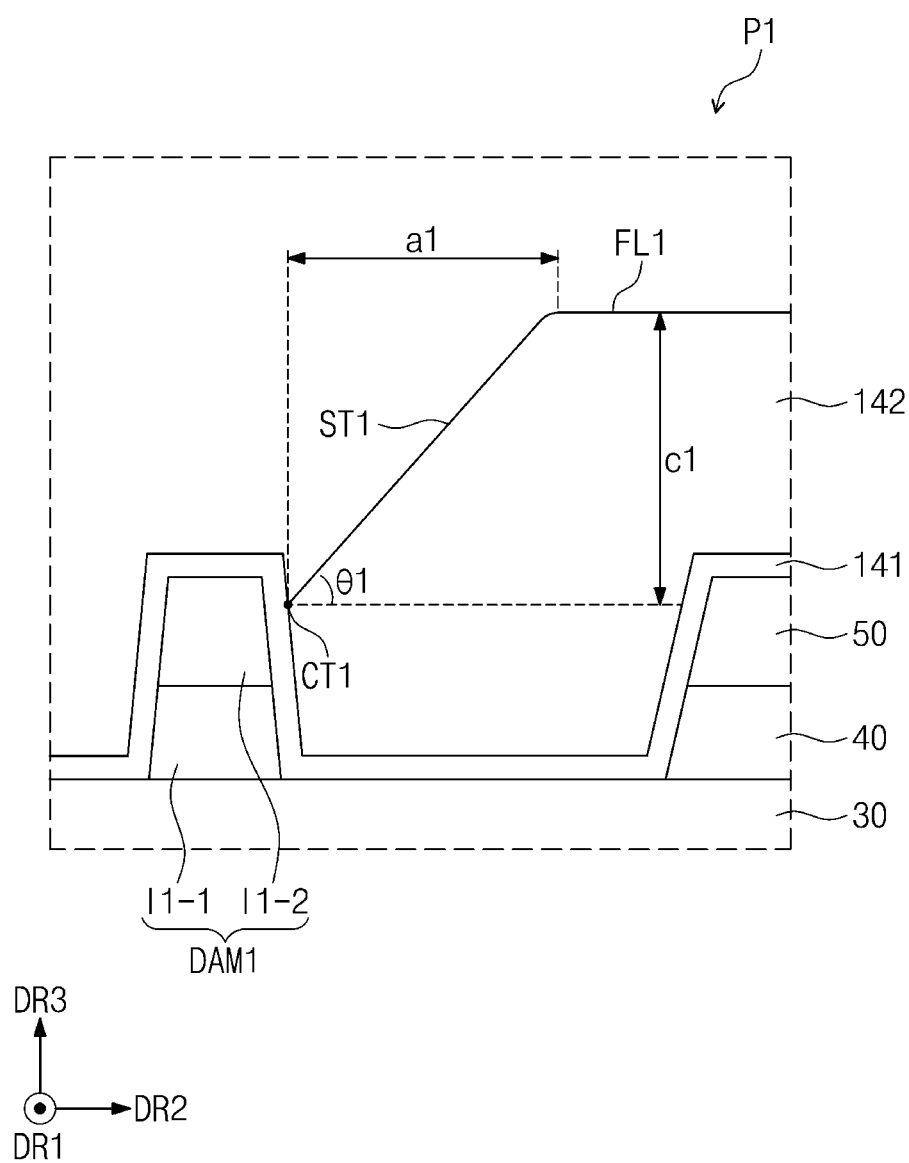
FIGS. 6A and 6B are enlarged cross-sectional views of a portion of a display module according to an embodiment of the present inventive concept.
Figure 6B:
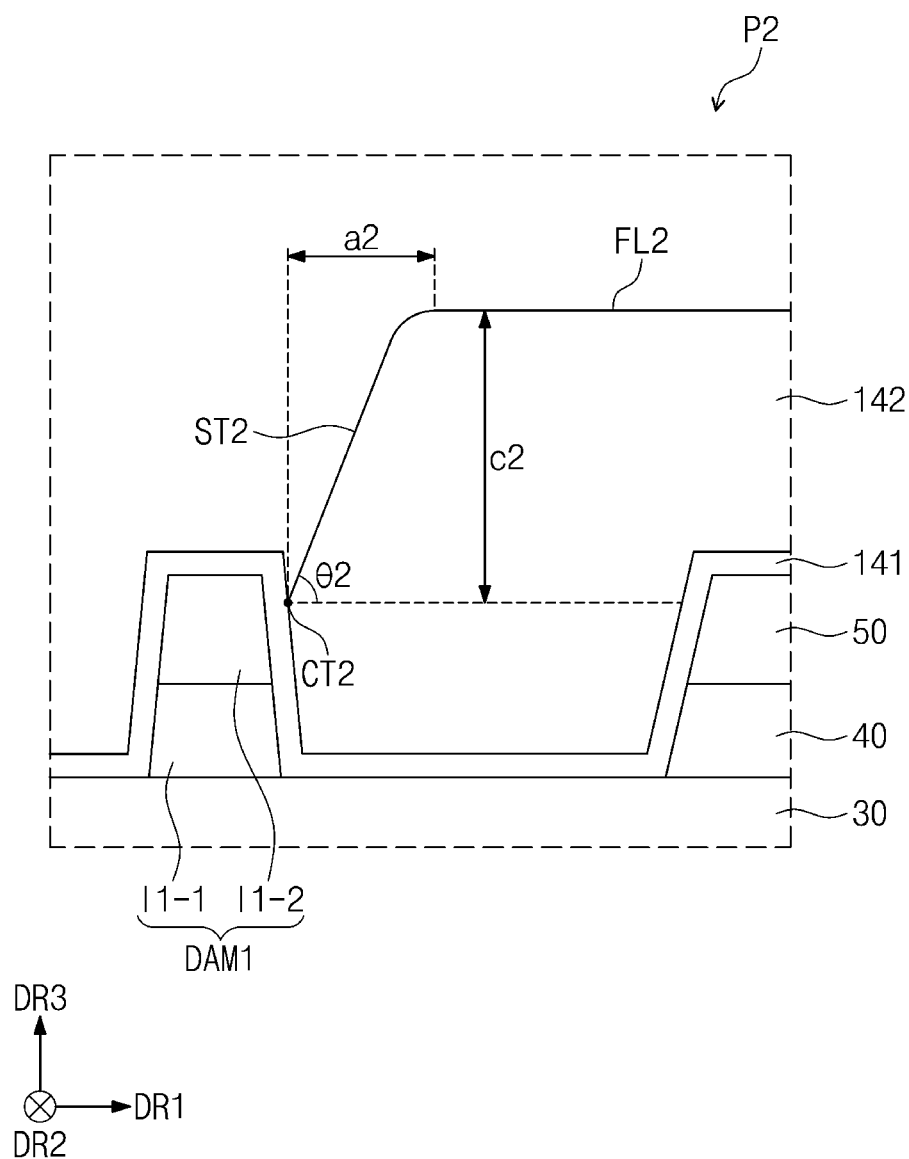

FIGS. 6A and 6B are enlarged cross-sectional views of a portion of a display module according to an embodiment of the present inventive concept. FIG. 6A is are enlarged view of the first part P1 shown in FIG. 5A, and FIG. 6B is an enlarged view of the second part P2 shown in FIG. 5B.

Referring to FIGS. 5A, 5B, 6A and 6B together, the organic encapsulation layer 142 includes inclined parts ST1 and ST2 and flat parts FL1 and FL2.

The inclined parts ST1 and ST2 are portions adjacent to the first side SD1 and the second side SD2, respectively, when compared to the flat parts FL1 and FL2, and may be portions having an inclined surface inclined at a predetermined angle with respect to a surface parallel to the upper surface of the base layer 110. In an embodiment of the present inventive concept, the inclined parts ST1 and ST2 may contact the side surface of the first dam structure DAM1. In an embodiment of the present inventive concept, in the organic encapsulation layer 142, contact points CT1 and CT2 at which the inclined parts ST1 and ST2 come into contact with the side surface of the first dam structure DAM1 may be defined.

The flat parts FL1 and FL2 may be portions having a substantially flat surface parallel to the upper surface of the base layer 110. The flat parts FL1 and FL2 may extend from the inclined parts ST1 and ST2 and may be portions spaced apart from the first side SD1 and the second side SD2 with the inclined part ST1 and ST2 therebetween. For example, the flat parts FL1 and FL2 may be portions more adjacent to the display area DA when compared to the inclined parts ST1 and ST2. At least portions of the flat parts FL1 and FL2 may overlap the display area DA. In addition, unlike shown in FIGS. 5A and 5B, some of the inclined parts ST1 and ST2 may also overlap the display area DA, and in this case, all of the flat parts FL1 and FL2 may overlap the display area DA.

In the first part P1, the organic encapsulation layer 142 includes a first inclined part ST1 and a first flat part FL1, and the first inclined part ST1 is disposed to form a first angle θ1 with a surface (or, e.g., a line) parallel to the upper surface of the base layer 110 based on the first contact point CT1 where the first inclined part ST1 contacts the first dam structure DAM1. In the second part P2, the organic encapsulation layer 142 includes a second inclined part ST2 and a second flat part FL2, and the second inclined part ST2 is disposed to form a second angle θ2 with a surface (or, e.g., line) parallel to the upper surface of the base layer 110 based on the second contact point CT2 where the second inclined part ST2 contacts the first dam structure DAM1. In the organic encapsulation layer 142 of an embodiment of the present haven concept, the first angle θ1 formed by the first inclined part ST1 is less than the second angle θ2 formed by the second inclined part ST2. For example, the first inclined part ST1 may have an inclined surface having a gentle inclination compared to the second inclined part ST2. For example, the slope of the second inclined part ST2 is steeper than that of the first inclined part ST1.

The difference between the first angle θ1 and the second angle θ2 may be, for example, about 0.05 degrees or more and about 0.2 degrees or less. In addition, in FIGS. 5A to 6B, the first angle θ1 and the second angle θ2 are displayed as about 45 degrees or more, but this is an exaggerated angle for convenience of description and clarity, and the first angle θ1 and the second angle θ2 may be about 5 degrees or less. In an embodiment of the present inventive concept, the first angle θ1 may be an angle of about 0.9 degrees or more and about 1 degree or less, and the second angle θ2 may be an angle of about 1 degree or more and about 1.2 degrees or less.

When the minimum distance from the contact points CT1 and CT2, where the inclined parts ST1 and ST2 and the side surfaces of the first dam structure DAM1 are in contact with each other, to their respective starting point of the respective flat parts FL1 and FL2 is defined as the inclination distances a1 and a2, respectively, the first inclination distance a1, which is the inclination distance in the first part P1, may be different from the second inclination distance a2, which is the inclination distance in the second part P2. When the height in the third direction DR3 from the contact points CT1 and CT2 to the upper surfaces of the flat parts FL1 and FL2 is defined as the heights c1 and c2 of the flat parts FL1 and FL2, the inclination distances a1 and a2 may be defined as a distance from the contact points CT1 and CT2 to the first point reaching the heights c1 and c2 of the flat parts FL1 and FL2.

In an embodiment of the present inventive concept, the first inclination distance a1 may be greater than the second inclination distance a2. In the organic encapsulation layer 142 included in the display module DM of an embodiment of the present inventive concept, as the first inclined part ST1 has a relatively gentle inclination compared to the second inclined part ST2, the first inclination distance a1 may be greater than the second inclination distance a2. Moreover, the cross section showing the first part P1 corresponds to the plane defined by the second direction DR2 and the third direction DR3, and the first inclination distance a1 may be defined as a minimum distance from the first contact point CT1 to the first flat part FL1 in a direction between the second direction DR2 and the third direction DR3. The cross section showing the second part P2 corresponds to a plane defined by the first direction DR1 and the third direction DR3, and the second inclination distance a2 may be defined as a minimum distance from the second contact point CT2 to the second flat part FL2 in a direction between the first direction DR1 and the third direction DR3.

The difference between the first inclination distance a1 and the second inclination distance a2 may be about 40 micrometers or more and about 200 micrometers or less. The first inclination distance a1 may be, for example, about 640 micrometers or more and 670 micrometers or less, and the second inclination distance a2 may be, for example, about 550 micrometers or more and about 630 micrometers or less.

In addition, in each of the first part P1 and the second part P2, heights of the flat parts FL1 and FL2 in the third direction DR3 from the contact points CT1 and CT2 where the inclined parts ST1 and ST2 and the side surfaces of the first dam structure DAM1 are in contact with each other to upper surfaces may be substantially the same. For example, the first height c that is the height in the third direction DR3 from the first contact point CT1 to the upper surface of the first flat part FL1 in the first part PI may be substantially the same as the second height c2, which is the height in the third direction DR3 from the second contact point CT2 to the upper surface of the second flat part FL2, in the second part P2. In addition, in the present specification, the term "substantially the same" in numerical value such as height includes not only the case where each numerical value is physically the same, but also the case where there is a difference by an error that may occur in the process even though the numerical values are designed to be the same. In an embodiment of the present inventive concept, the first height c1 and the second height c2 may each independently be about 8 micrometers or more and about 10 micrometers or less.

In the display module DM included in the display device of an embodiment of the present inventive concept, by differentiating the inclination angle (e.g., θ1 and θ2) and inclination distance (e.g., a1 and a2) of the organic encapsulation layer 142 disposed on each of the first part P1 and the second part P2, it is possible to prevent wire damage while minimizing a dead space.

For example, when referring to FIGS. 5A to 6B, in the display module DM according to an embodiment of the present inventive concept, the first part P1 is a portion adjacent to the first side SD1 on which pads such as a display pad DPD (refer to FIG. 3) and a detection pad PD (refer to FIG. 4B) are disposed, and corresponds to a portion in which the signal lines SL-1 and SL-2 to be connected to the pads are disposed. In the display module DM according to an embodiment of the present inventive concept, to prevent the signal lines SL-1 and SL-2 from being damaged due to the steep inclination of the organic encapsulation layer 142, in the first part P1 through which the signal lines SL-1 and SL-2 pass, the inclination of the organic encapsulation layer 142 is relatively gentle, and in the second part P2 through which the signal lines SL-1 and SL-2 do not pass, the inclination of the organic encapsulation layer 142 may be made relatively sharp to minimize the dead space. Accordingly, it is possible to provide a display module DM having a reduced dead space without damaging wires and a display device including the same.

In addition, in each of the first part P1 and the second part P2, except that the inclined parts ST1 and ST2 of the organic encapsulation layer 142 have different inclination angles and inclination distances from each other, the underlying structures and materials may be designed the same. For example, in each of the first part P1 and the second part P2, the height, thickness, inclination, and material of the first dam structure DAM1 and the material and film roughness of the first inorganic encapsulation layer 141 may all be designed to be the same. In the display module DM according to an embodiment of the present inventive concept, in each of the first part P1 and the second part P2, while the underlying structure and material are designed to be the same, the inclination angle and inclination distance of the inclined parts ST1 and ST2 of the organic encapsulation layer 142 may be adjusted differently.

Figure 7A:
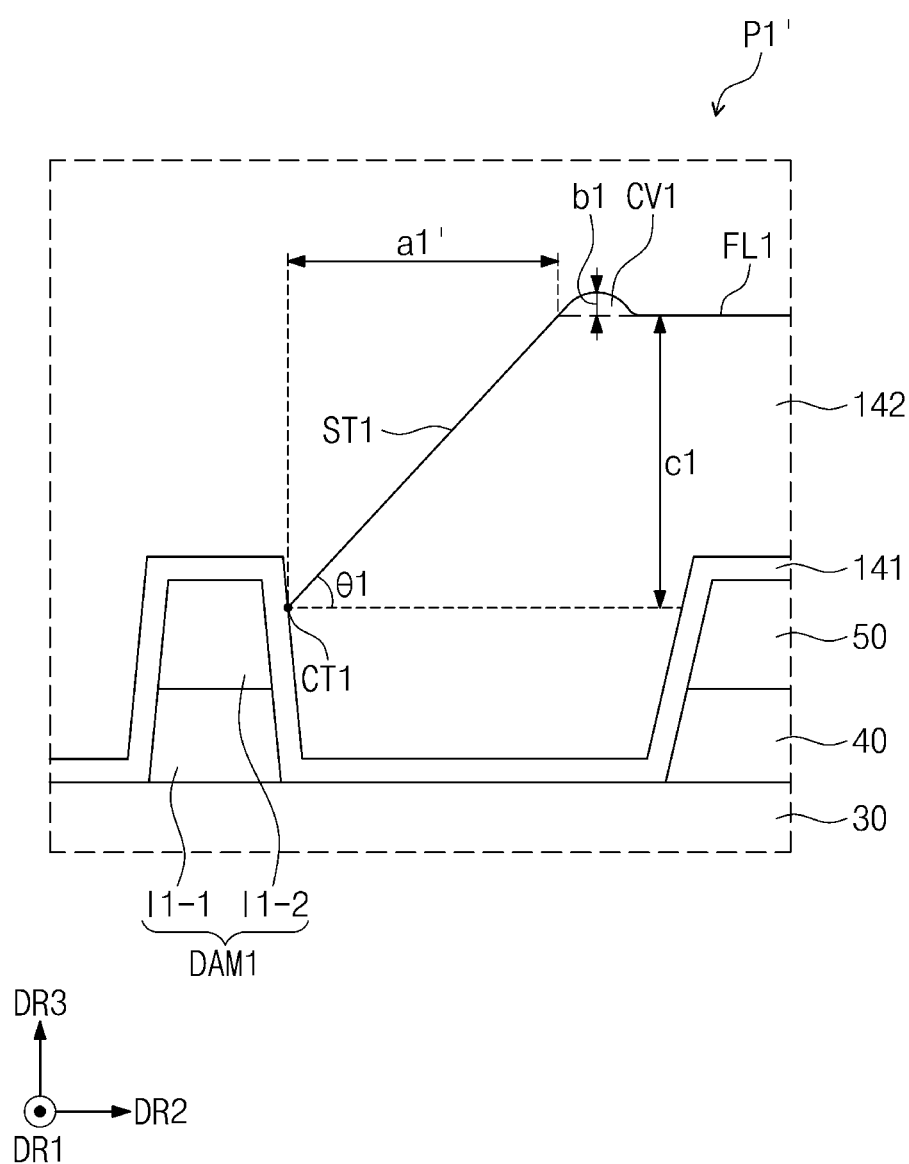
FIGS. 7A and 7B are enlarged cross-sectional views of a portion of a display module according to an embodiment of the present inventive concept.
Figure 7B:
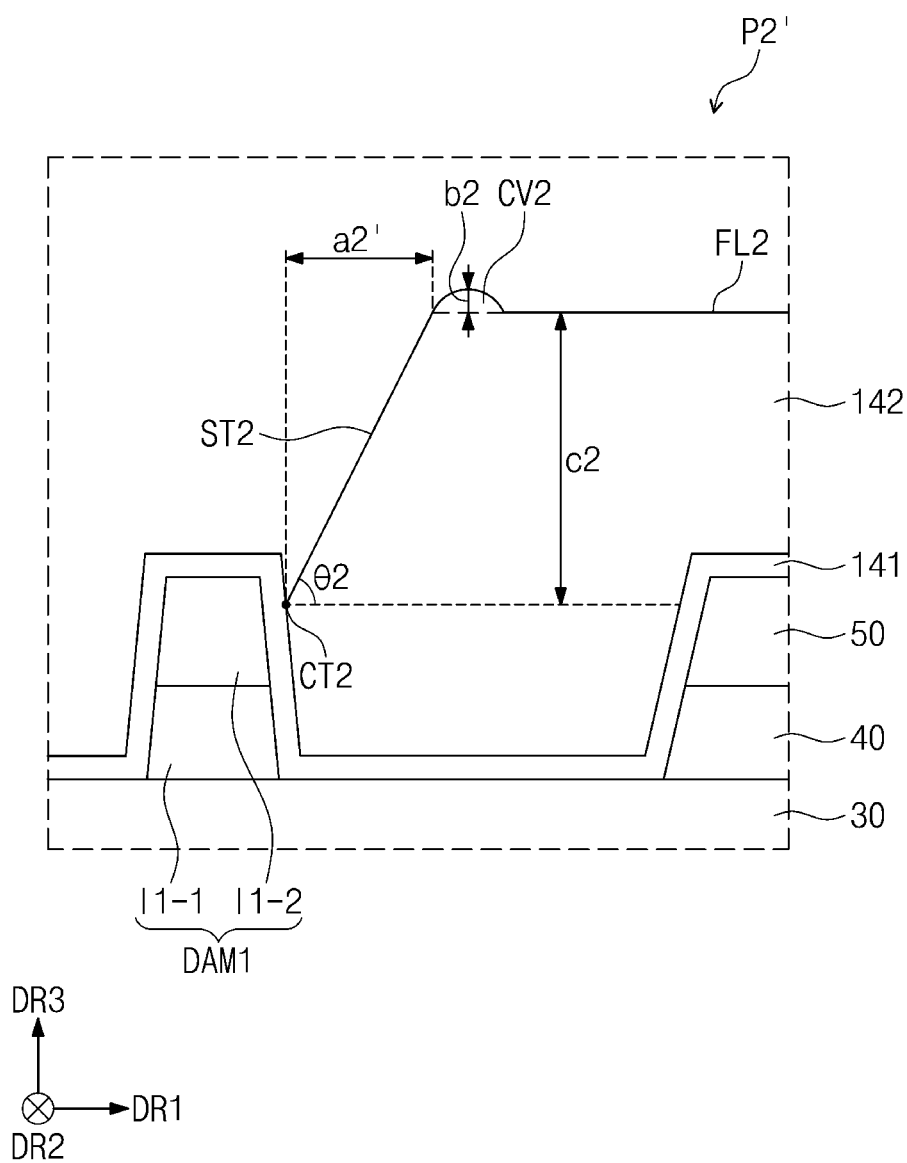

FIGS. 7A and 7B are enlarged cross-sectional views of a portion of a display module according to an embodiment of the present inventive concept. FIG. 7A shows a first part P1' of an embodiment of the present inventive concept that is partially different from the embodiment shown in FIG. 6A, and FIG. 7B shows a second part P2' of an embodiment of the present inventive concept that is partially different from the embodiment shown in FIG. 6B. Hereinafter, in describing the first part P1' and the second part P2' of an embodiment of the present inventive concept with reference to FIGS. 7A and 7B, the same reference numerals are assigned to the same components as those described above, and detailed descriptions thereof may be omitted.

Referring to FIGS. 7A and 7B, the organic encapsulation layer 142 according to an embodiment of the present inventive concept may further include protruding parts CV1 and CV2 disposed between the inclined parts ST1 and ST2 and the flat parts FL1 and FL2. In the first part P1, the first protruding part CV1 may be disposed between the first inclined part ST1 and the first flat part FL1, and in the second part P2, the second protruding part CV2 may be disposed between the second inclined part ST2 and the second flat part FL2.

Each of the first protruding part CV1 and the second protruding part CV2 may include a protruding surface protruding upward in the third direction DR3. Each of the protruding surfaces of the first protruding part CV1 and the second protruding part CV2 may be a convex surface disposed above the upper surfaces of the flat parts FL1 and FL2. However, the present inventive concept is not limited thereto. For example, each of the first protruding part CV1 and the second protruding part CV2 may have a polygonal shape. For example, each of the first protruding part CV1 and the second protruding part CV2 may be positioned above the flat parts FL1 and FL2 by a predetermined protruding height b1 and b2.

In an embodiment of the present inventive concept, each of the protruding surfaces of the first protruding part CV1 and the second protruding part CV2 may be a concave surface.

In each of the first protruding part CV1 and the second protruding part CV2, each of the protrusion heights b1 and b2 protruding from the upper surfaces of the flat parts FL1 and FL2 may be about 1 micrometer or more and about 2 micrometers or less. The first protruding height b1 of the first protruding part CV1 and the second protruding height b2 of the second protruding part CV2 may be substantially the same. In addition, the first protruding height b1 may have a larger value than the second protruding height b2. A difference between the first protruding height b1 and the second protruding height b2 may be about 0.1 micrometers or less.

In addition, when the organic encapsulation layer 142 includes the protruding parts CV1 and CV2 as shown in FIGS. 7A and 7B, the inclination distances a1' and a2' are not the minimum distances from the contact points CT1 and CT2 to the point where the flat parts FL1 and FL2 start, and may be the minimum distance from the contact points CT1 and CT2 to the point where the protruding parts CV1 and CV2 start. When the height in the third direction DR3 from the contact points CT1 and CT2 to the upper surfaces of the flat parts FL1 and FL2 is the heights c1 and c2 of the flat parts FL1 and FL2, the inclination distances a1' and a2' may be a distance from the contact points CT1 and CT2 to the first point reaching the heights c1 and c2 of the flat parts FL1 and FL2.

The first inclination distance a1' may be greater than the second inclination distance a2'. The first inclination distance a1 may be a minimum distance from the first contact point CT1 to the first protruding part CV1 in the direction between the second direction DR2 and the third direction DR3. The second inclination distance a2' may be a minimum distance from the second contact point CT2 to the second protruding part CV2 in the direction between the first direction DR1 and the third direction DR3.

The difference between the first inclination distance a1' and the second inclination distance a2' may be about 40 micrometers or more and about 200 micrometers or less. The first inclination distance a1' may be, for example, about 640 micrometers or more and 670 micrometers or less, and the second inclination distance a2' may be, for example, about 550 micrometers or more and about 630 micrometers or less.

Figure 8A:
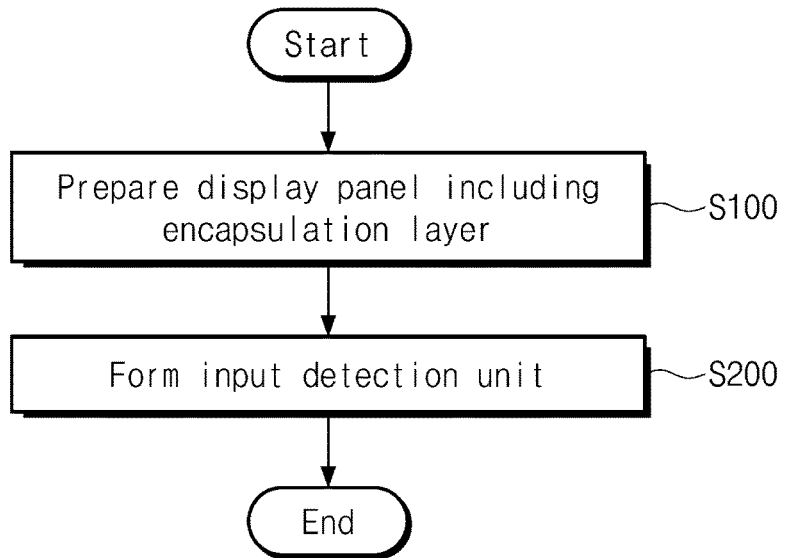
FIG. 8A is a flowchart illustrating each operation of a method of manufacturing a display device according to an embodiment of the present inventive concept.
Figure 8B:
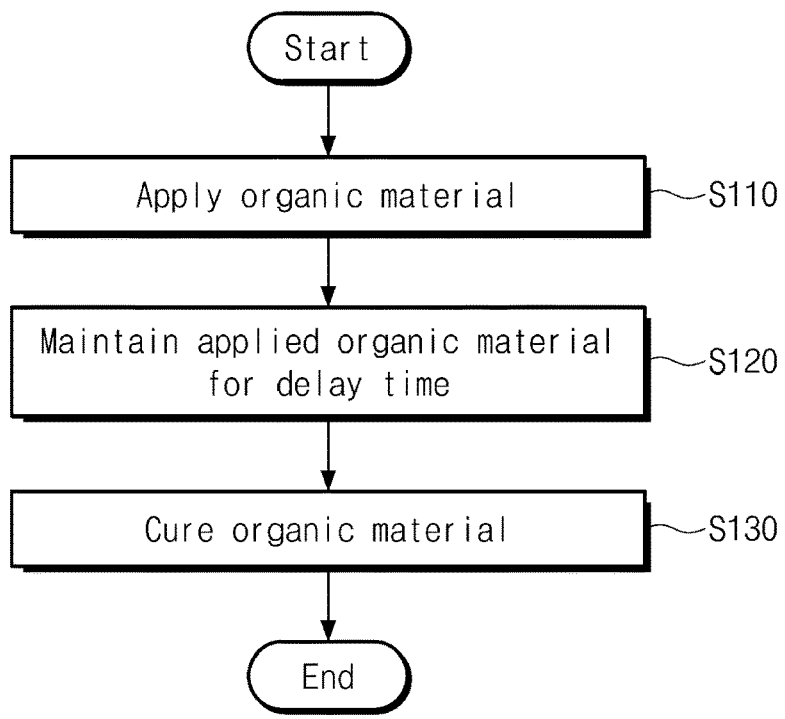
FIG. 8B is a flowchart illustrating some operations of a method of manufacturing a display device according to an embodiment of the present inventive concept.

FIG. 8A is a flowchart illustrating each operation of a method of manufacturing a display device according to an embodiment of the present inventive concept. FIG. 8B is a flowchart illustrating some operations of a method of manufacturing a display device according to an embodiment of the present inventive concept. FIG. 8B is a flowchart illustrating an operation of forming an encapsulation layer in a method of manufacturing a display device according to an embodiment of the present inventive concept. FIGS. 9A to 9I) are cross-sectional views sequentially illustrating operations of a method of manufacturing a display device according to an embodiment of the present inventive concept. Hereinafter, a method of manufacturing a display device according to an embodiment of the present inventive concept will be described with reference to FIGS. 8A to 9D, and the same reference numerals are assigned to the same components as those described above, and detailed descriptions thereof may be omitted.

Referring to FIGS. 2, 3, 8A and 8B, a method of manufacturing a display device according to an embodiment of the present inventive concept includes preparing a display panel including an encapsulation layer in operation S100, and forming an input detection unit on the display panel in operation 5200. As described above with reference to FIGS. 2 and 3, the display panel DP is divided into a display area DA and a non-display area NDA, and may include a base layer 110, a circuit layer 120, a light emitting element layer 130, and an encapsulation layer 140, which are sequentially stacked. In the method of manufacturing a display device according to an embodiment of the present inventive concept, forming the encapsulation layer 140 included in the display panel DP includes applying an organic material in operation S110, maintaining the applied organic material for a predetermined delay time in operation S120, and curing the organic material after the delay time in operation S130. In this specification maintaining the organic material for a predetermined delay time in operation S120 may be referred to as a "delay operation".

Figure 9A:
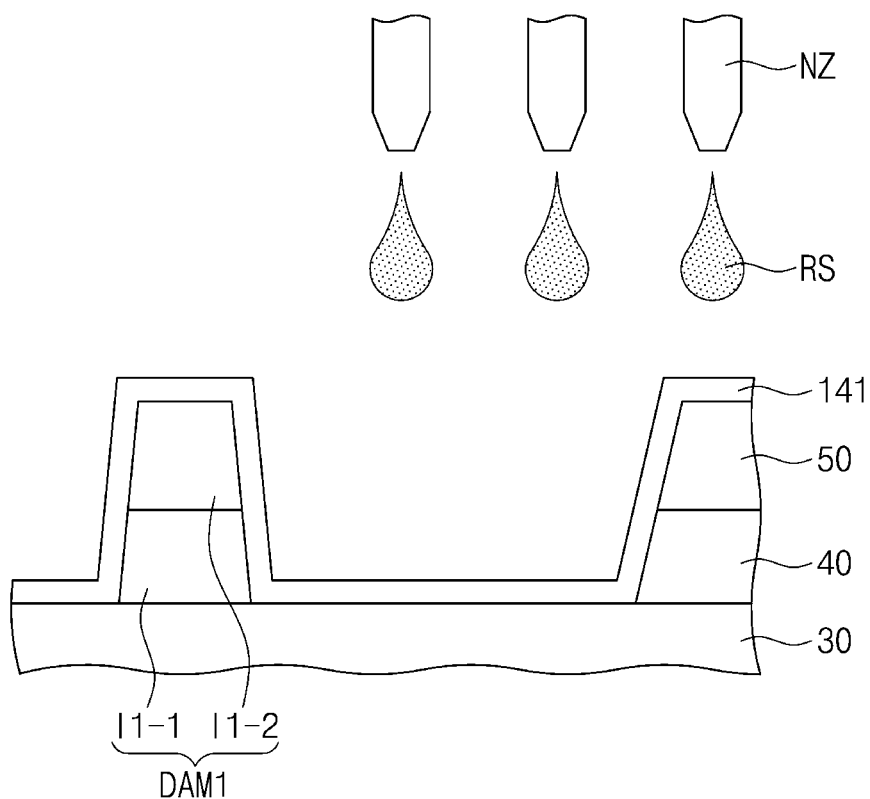
FIGS. 9A, 9B, 9C and 9D are cross-sectional views sequentially illustrating operations of a method of manufacturing a display device according to an embodiment of the present inventive concept.
Figure 9B:
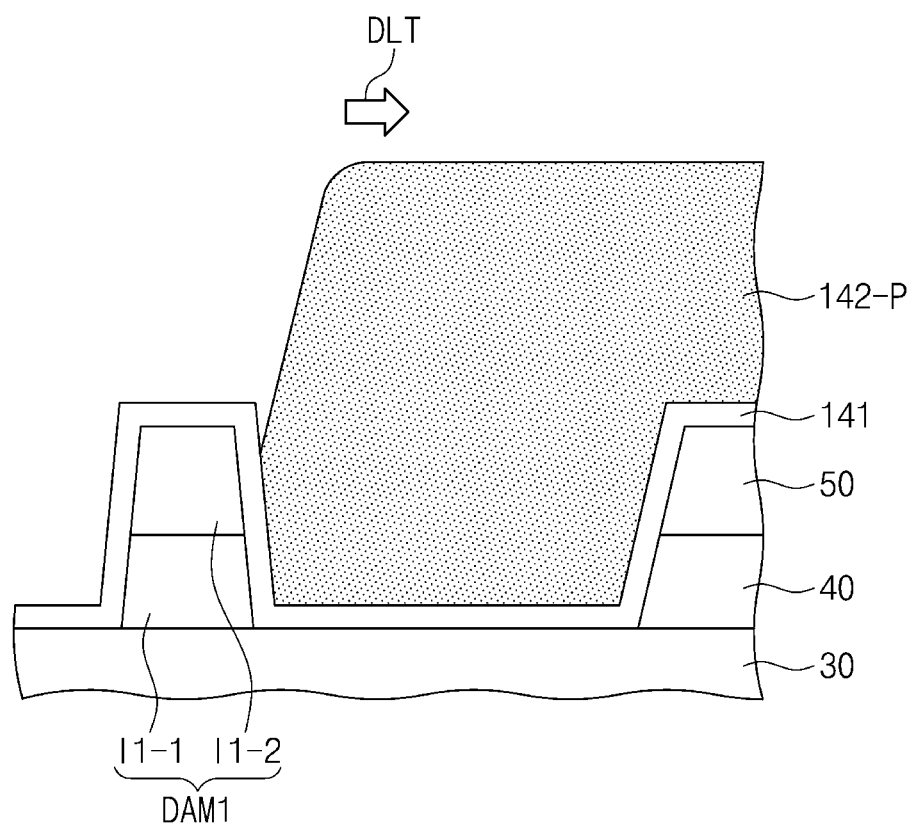
Figure 9C:
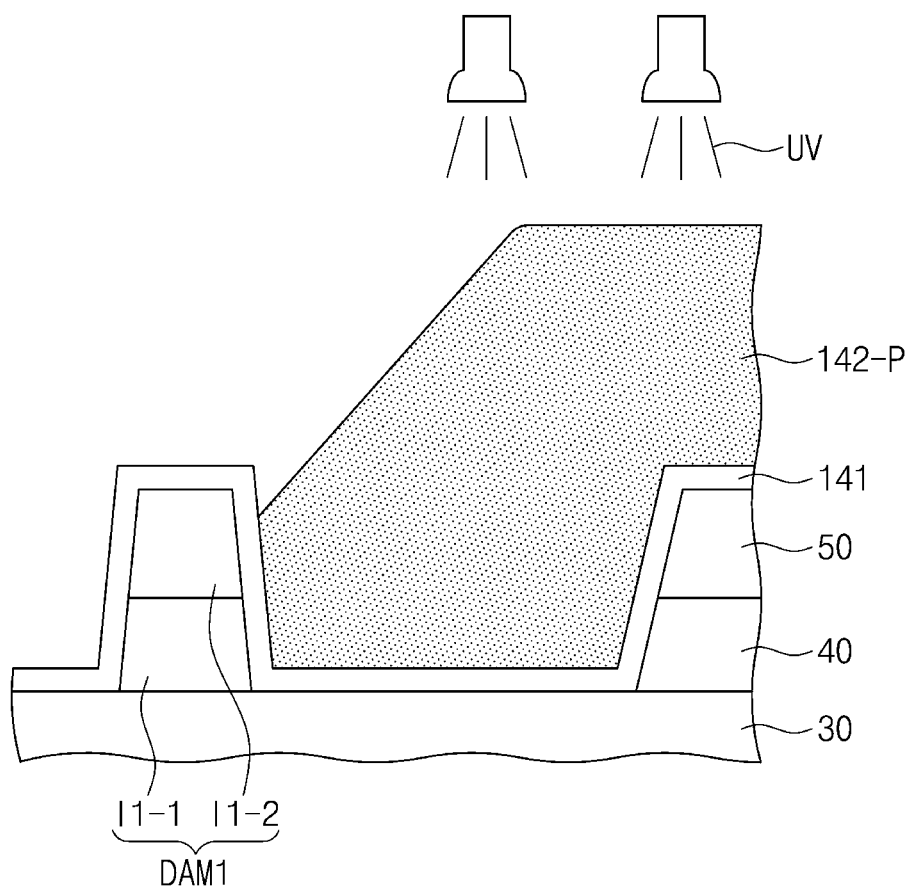
Figure 9D:
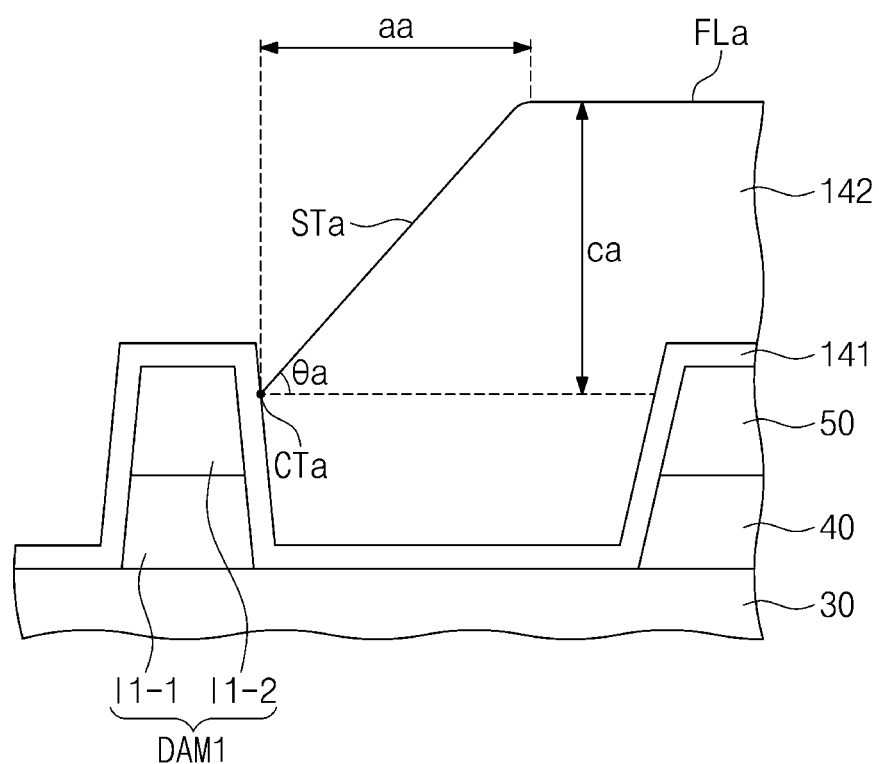

Referring to FIGS. 8B, 9A, and 9B together, forming an encapsulation layer in a method of manufacturing a display device according to an embodiment of the present inventive concept may include applying an organic material RS to form a preliminary organic encapsulation layer 142-P. The organic material RS may be provided on a pre-prepared lower structure, for example, the third insulating layer 30 the fourth insulating layer 40, the fifth insulating layer 50, the first dam structure DAM1, and the first inorganic encapsulation layer 141. The organic material RS may include, for example, an acryl-based polymer or a silicone-based based polymer. As a method of applying the organic material RS, an inkjet printing method may be used. The organic material RS may be provided through the nozzle NZ, and may be provided to maintain a substantially constant coating thickness on the lower structure. However, in the outer portion of the preliminary organic encapsulation layer 142-P formed through the organic material RS, for example, the portion of the preliminary organic encapsulation layer 142-P adjacent to the first dam structure DAM1, due to the characteristics of the organic material RS provided in a liquid phase, an inclination surface with reduced inclination is formed, such that a portion having a non-uniform thickness may be formed.

Referring to FIGS. 8B and 9A to 9C together, forming the encapsulation layer in the method of manufacturing a display device according to an embodiment of the present inventive concept further includes a delay operation of maintaining the applied organic material for a predetermined delay time DLT before curing the preliminary organic encapsulation layer 142-P. For example, in forming the encapsulation layer, after forming a preliminary organic encapsulation layer 142-P by applying an organic material RS, by leaving the preliminary organic encapsulation layer 142-P for a predetermined delay time DLT, a time for the preliminary organic encapsulation layer 142-P to flow may be provided.

In addition, as the preliminary organic encapsulation layer 142-P is left for a predetermined delay time DLT, the preliminary organic encapsulation layer 142-P may be formed to have a predetermined inclination while contacting the side surface of the first dam structure DAM1. In the delay operation, by changing the delay time DLT for leaving the preliminary organic encapsulation layer 142-P, the inclination of the organic encapsulation layer 142 to be formed later may be differently formed. For example, the inclination of the organic encapsulation layer 142 may be partially based on the delay time DLT.

In addition, forming the encapsulation layer according to an embodiment of the present inventive concept may further include pre-curing the preliminary organic encapsulation layer 142-P before the delay operation of leaving the preliminary organic encapsulation layer 142-P for a delay time DLT. The provisional curing operation is performed before the main curing, and may or may not be performed in consideration of the characteristics of the organic material RS. The provisional curing operation may be performed immediately as a continuous process after applying the above-described organic material RS.

Referring to FIGS. 8B and 9B to 9D together, forming an encapsulation layer according to an embodiment of the present inventive concept includes curing the preliminary organic encapsulation layer 142-P, on which a predetermined inclination is formed after the delay operation, to form the organic encapsulation layer 142. The organic encapsulation layer 142 may be photocurable. The organic encapsulation layer 142 may be photocured by ultraviolet (UV) light.

Similar to the contents described in FIGS. 6A and 6B, the formed organic encapsulation layer 142 may include an inclined part STa and a flat part FLa, and the inclined part STa may be disposed to form a predetermined inclination angle θa with a surface (or, e.g., line) parallel to the upper surface of the base layer 110 (refer to FIG. 5A) based on the contact point CTa where the inclined part STa contacts a side surface of the first dam structure DAM1. In addition, the formed organic encapsulation layer 142 may have a predetermined inclination distance aa from the contact point CTa, where the inclined part. STa and the side surface of the first dam structure DAM1 are in contact with each other, to the point where the flat part FLa starts.

The inclination angle θa and the inclination distance aa of the inclined part STa of the organic encapsulation layer 142 may be adjusted differently by varying the delay time DLT in the delay operation. In an embodiment of the present inventive concept, when the delay time DLT is increased, the inclination angle θa may decrease and the inclination distance aa may increase. For example, if the delay time DLT is lengthened, an inclined part STa with a gentle inclination may be formed. When the delay time DLT is shortened, the inclination angle θa may increase and the inclination distance aa may decrease. For example, when the delay time DLT is shortened, an inclined part STa of relatively abrupt inclination may be formed. In a part of the display module of the embodiment shown in FIGS. 6A and 6B, the delay time DLT when forming the first inclined part ST1 of the first part P1 may be longer compared to the delay time DLT when forming the second inclined part ST2 of the second part P2. Accordingly, the first inclined part ST1 may have a relatively gentle inclination compared to the second inclined part ST2. In one embodiment of the present inventive concept, the delay time DLT for forming the first inclined part ST1 may be about 60 seconds, and the delay time DLT for forming the second inclined part ST2 may be about 18 seconds.

The method of manufacturing a display device according o an embodiment of the present inventive concept includes a delay operation of leaving the applied organic material for a predetermined delay time when forming the organic encapsulation layer, and the inclination of the formed organic encapsulation layer may be controlled by adjusting the delay time of the delay operation. Accordingly, the inclination of the organic encapsulation layer may be differently formed in each part of the display device while maintaining the same physical properties such as the underlying structure, material, and roughness of the underlying film. Accordingly, the organic encapsulation layer inclination of the first part and the second part may be formed differently as described above without significantly changing the process and design, and accordingly, it is possible to provide a display module having a reduced dead space without damaging wires through a simple process and a method of manufacturing a display device including the same.

According to an embodiment of the present inventive concept, a display device and a method for manufacturing the same are provided in which, in the portion where the signal line passes, the inclination of the organic encapsulation layer is formed to have a relatively gentle slope to prevent damage to the signal line, and in the portion where the signal line does not pass, the inclination of the organic encapsulation layer is formed by relatively rapid inclination, so that the dead space may be minimized.

While the present inventive concept has been described with reference to embodiments thereof, it will be understood by those of ordinary skill in the art that various changes in form and details may be made thereto without departing from the spirit and scope of the present inventive concept.

What is claimed is:

1. A display device comprising:
a display panel including a display area and a non-display area, the display panel including a base layer, a light emitting element layer disposed on the base layer and including a light emitting element, and an encapsulation layer disposed on the light emitting element; and
an input detection unit disposed on the display panel, the input detection unit including a detection pad, a detection electrode, and a signal line, wherein the detection pad is disposed in a pad area overlapping the non-display area, wherein the detection electrode overlaps the display area, and the signal line connects the detection pad and the detection electrode to each other,
wherein the display panel comprises:
a first side extending in a first direction; and
a second side extending in a second direction crossing the first direction,
wherein the detection pad is disposed adjacent to the first side,
wherein the encapsulation layer comprises an organic encapsulation layer,
wherein the organic encapsulation layer comprises:
an inclined part adjacent to the first side and the second side; and
a flat part extending from the inclined part,
wherein a first angle formed by the inclined part with respect to an upper surface of the base layer in a first part of the display panel and input detection unit adjacent to the first side is less than a second angle formed by the inclined part with respect to the upper surface of the base layer in a second part of the display panel and input detection unit adjacent to the second side.

2. The display device of claim 1, wherein the display panel further comprises a dam structure disposed adjacent to the first side and the second side,
wherein the organic encapsulation layer is in contact with a side surface of the dam structure.

3. The display device of claim 2, wherein a minimum distance from a contact point, which is where the inclined part and the side surface of the dam structure contact each other, to the flat part is an inclination distance,
wherein a first inclination distance that is the inclination distance in the first part is greater than a second inclination distance that is the inclination distance in the second part.

4. The display device of claim 3, wherein a difference between the first inclination distance and the second inclination distance is about 40 micrometers or more and about 200 micrometers or less.

5. The display device of claim 2, wherein the dam structure comprises a first dam structure and a second dam structure spaced further apart from the display area than the first dam structure,
wherein the organic encapsulation layer is in contact with a side surface of the first dam structure.

6. The display device of claim 2, further comprising a circuit layer disposed between the base layer and the light emitting element layer and including a plurality of insulating layers,
wherein the dam structure comprises a plurality of layers corresponding to at least some of the plurality of insulating layers.

7. The display device of claim 2, wherein the dam structure has a shape at least partially surrounding the display area.

8. The display device of claim 2, wherein the first angle and the second angle are formed at a contact point where the organic encapsulation layer and the side surface of the dam structure contact.

9. The display device of claim 1, wherein the organic encapsulation layer further comprises a protruding part disposed between the inclined part and the flat part and including a protruding surface protruding in a third direction intersecting the first and second directions.

10. The display device of claim 1, wherein a difference between the first angle and the second angle is about 0.05 degrees or more and about 0.2 degrees or less.

11. The display device of claim 1, wherein the encapsulation layer further comprises a plurality of inorganic encapsulation layers,
wherein the organic encapsulation layer is disposed between the plurality of inorganic encapsulation layers.

12. The display device of claim 1, wherein the input detection unit comprises:
a first detection insulating layer disposed on the encapsulation layer;
a first conductive layer disposed on the first detection insulating layer;
a second detection insulating layer disposed on the first conductive layer;
a second conductive layer disposed on the second detection insulating layer; and
a third detection insulating layer disposed on the second conductive layer.

13. The display device of claim 12, wherein the signal line comprises a first signal line and a second signal line, wherein the first signal line is disposed on the first detection insulating layer, and the second signal line is disposed on the second detection insulating layer.

14. A display device comprising:
a display panel including a display area and a non-display area, the display panel including a light emitting element layer with a light emitting element overlapping the display area, an encapsulation layer disposed on the light emitting element, and a dam structure overlapping the non-display area; and
an input detection unit disposed on the display panel, the input detection unit including a detection pad, a detection electrode, and a signal line, wherein the detection pad is disposed in a pad area overlapping the non-display area, wherein the detection electrode overlaps the display area, and the signal line connects the detection pad and the detection electrode to each other,
wherein the display panel comprises:
a first side extending in a first direction; and a second side extending in a second direction crossing the first direction, wherein the detection pad is disposed adjacent to the first side, wherein the encapsulation layer comprises an organic encapsulation layer, wherein the organic encapsulation layer comprises:

an inclined part adjacent to the first side and the second side; and a flat part connected to the inclined part, wherein a minimum distance from a contact point, at which the organic encapsulation layer and a side surface of the dam structure contact each other, to the flat part is an inclination distance, wherein a first inclination distance that is the inclination distance in a first part of the display panel and input detection unit is greater than a second inclination distance that is the inclination distance in a second part of the display panel and input detection unit.

15. The display device of claim 14, wherein a difference between the first inclination distance and the second inclination distance is about 40 micrometers or more and about 200 micrometers or less.

16. The display device of claim 14, wherein the dam structure has a shape at least partially surrounding the display area.

17. A method for manufacturing a display device, the method comprising:

preparing a display panel including a display area and a non-display area, the display panel including a base layer, a light emitting element layer disposed on the base layer and including a light emitting element, and an encapsulation layer disposed on the light emitting element; and forming an input detection unit disposed on the display panel, the input detection unit including a detection pad, a detection electrode, and a signal line, wherein the detection pad is disposed in a pad area overlapping the non-display area, wherein the detection electrode overlaps the display area, and the signal line connect the detection pad and the detection electrode to each other, wherein the display panel comprises:

a first side extending in a first direction; and a second side extending in a second direction crossing the first direction, wherein the detection pad is formed adjacent to the first side, wherein the forming of the encapsulation layer comprises:

applying an organic material;

performing a delay operation of maintaining the applied organic material for a predetermined delay time; and curing the organic material after the predetermined delay time, wherein, in a first part of the display panel and the input detection unit adjacent to the first side, the organic material is maintained for a first delay time in the delay operation, wherein, in a second part of the display panel and the input detection unit adjacent to the second side, the organic material is maintained for a second delay time in the delay operation, wherein the first delay time is longer than the second delay time.

18. The method of claim 17, wherein the forming of the encapsulation layer further comprises pre-curing the applied organic material before the delay operation.

19. The method of claim 17, wherein the display panel comprises a dam structure disposed adjacent to the first side and the second side in the preparing of the display panel, wherein the applied organic material is in contact with a side surface of the dam structure in the delay operation.

20. The method of claim 19, wherein an organic encapsulation layer covering the light emitting element is formed after the curing of the organic material, wherein based on a contact point, at which the organic encapsulation layer and the side surface of the dam structure contact each other, a first angle formed by the organic encapsulation layer with respect to an upper surface of the base layer in the first part is less than a second angle formed by the organic encapsulation layer with respect to the upper surface of the base layer in the second part.

* * * * *